United States Patent
Liao

(10) Patent No.: US 9,026,982 B2
(45) Date of Patent: May 5, 2015

(54) WIRING BOARD DESIGN SYSTEM AND WIRING BOARD DESIGN METHOD

(71) Applicant: Simplify Design Automation, Inc., Sunnyvale, CA (US)

(72) Inventor: Zen Z. Liao, San Ramon, CA (US)

(73) Assignee: Simplify Design Automation, Inc., San Ramon, CA (US)

( * ) Notice: Subject to any disclaimer, the term of this patent is extended or adjusted under 35 U.S.C. 154(b) by 0 days.

(21) Appl. No.: 14/196,665

(22) Filed: Mar. 4, 2014

(65) Prior Publication Data

US 2014/0250418 A1 Sep. 4, 2014

Related U.S. Application Data

(60) Provisional application No. 61/772,269, filed on Mar. 4, 2013.

(51) Int. Cl.
G06F 17/50 (2006.01)

(52) U.S. Cl.
CPC .................................. *G06F 17/5077* (2013.01)

(58) Field of Classification Search
USPC ................................... 716/126, 137, 136, 115
See application file for complete search history.

(56) References Cited

U.S. PATENT DOCUMENTS

| | | | | |
|---|---|---|---|---|
| 6,385,758 | B1* | 5/2002 | Kikuchi et al. | 716/122 |
| 2011/0061039 | A1* | 3/2011 | Kumagai et al. | 716/126 |
| 2012/0254821 | A1* | 10/2012 | Baba | 716/136 |

FOREIGN PATENT DOCUMENTS

JP 2005-267302 A 9/2005

* cited by examiner

*Primary Examiner* — Brian Ngo
(74) *Attorney, Agent, or Firm* — Westerman, Hattori, Daniels & Adrian, LLP

(57) ABSTRACT

An object of the present invention is to provide wiring board design system and wiring board design method to determine a component and a wiring pattern in real-time when designing a wiring on a circuit board. The wiring board design system provides a cloud service for a terminal which is used by users via a network. When to arrange components on the circuit board, while pushing out automatically wirings which are overlapped with the components on the arranging position, the wiring board design system secures a space on that can arrange the component. The wiring processing is performed automatically and the fine adjustment such as rotation, movement of arranged components is performed automatically if necessary. The processing for equalization is performed so as to be the equal wiring density on the circuit board.

12 Claims, 17 Drawing Sheets

Circuit board

Circuit board

WIRING BOARD DESIGN SYSTEM AND WIRING BOARD DESIGN METHOD

TECHNICAL FIELD

The present invention is related to a system and a method for designing a wiring board to determine a component and a wiring pattern in real-time when designing a wiring on a circuit board. Particularly, the present invention is related to a system and a method for designing a wiring board to determine an electrical element and a wiring pattern in real-time when designing a wiring on a wiring board such as a multichip module (MCM) and a printed circuit board (PCB).

BACKGROUND ART

Currently, the wiring board design work for designing a wiring of a wiring board is broadly divided into a circuit diagram design and a layout design. The layout design is mainly divided into a work for arranging electronic components on a circuit board and a wiring design for connecting terminals of the electronic components at each signal including an electric source. This wiring design is also said as a pattern design. Conventionally, in a wiring design of a wiring board, it is a common method drawing a wiring after determining a position, where an electronic component is arranged, and obtaining a rewiring while evaluating its wiring cost, etc.

The conventional wiring design is a method that draws a new wiring pattern pushing away a wiring pattern drawn earlier and then the wiring pattern is determined finally. In other words, it is the technique to draw a new wiring pattern between the wiring drawn earlier. The layout design must determine whether can be wired successfully the circuit board on which arranged components and furthermore must work successfully as required. Also, it is generally required that to wire with as less wiring layers as possible to reduce cost. Every year, while a signal speed becomes faster, the complexity of the design of the arrangement and the wiring increases more and more and the designing becomes a work spending a lot of a man-hour.

The study of an automatic arrangement and wiring by a computer began several decades ago, and it became a necessary design technique for large-scale LSI design recently. For example, in Patent Document 1, a wiring course decision method and a wiring course decision system, calculating wiring patterns between terminals, for wiring design of a wiring board including parts having many pins such as a multi-tip module (MCM) and a printed circuit boards (PCB) are disclosed.

A process of lead wiring which is from a component terminal is executed before the entire wiring processing and further the wiring processing is performed by moving the components connected to the wiring target on the virtual wiring board for performing optimally the lead wiring process. However, because shapes of electronic components used for PCB designs vary, a practical automatic arrangement system is not yet commercially available. Today, a wiring design becomes one of the most difficult works and is performed mainly by the "intuition" based on the longstanding experiences of designers. The layout design is performed in order of the previous step of arranging design and the next step of the wiring design.

When the arrangement design does not carry out well, the wiring design does not go well. It is difficult to determine how the arrangement design function because the wiring has not actually been done yet when the arrangement design is completed. In the wiring design, it is understood that there is a necessity to redo the arrangement after the most of the wiring is finished and then the arrangement design and the wiring design may be redone. This leads to increase the design time and man-hour. Therefore, it will be costly.

Patent Document 1: Japanese Patent Application Laid-open No. 2005-267302.

However, in conventional method, a work to draw the wiring after arranging the components on the circuit board is performed. In other words, wiring works start after finishing the arrangement of all components on the board. Currently, the downsizing of outline design and the enhancement of system function of electronic and electric products and the like are making the flowplan and the component arrangement of the wiring board more difficult problems. Because shapes of the components for PCB design vary and the wiring density is high, a practical automation system has not been developed yet.

Some wiring processing and the like are wired automatically by a software or a wiring simulation. For the high-speed circuit design, simulations and analyses are essential. However, it takes time to prepare layout after arranging components on the circuit board of the previous step. Therefore, preparing a layout, analyzing it, correcting the layout by reflecting the analyzing results, repeating all these cycles becomes high production cost and is not practical.

Conventionally, the judgement was mainly relied on Lutz distribution which is the distribution between terminals of components, but the Lutz is just a straight line connecting only terminals and has low accuracy in a complex wiring board design. Therefore, a real-time processing that draws wires while placing the components is required. Further, the conventional wiring board design system is not possible to design simultaneously from remote locations. By providing a management of electronic components on the cloud using a wiring board design database, there is a need to provide new information rapidly and to reduce the cost by using this central management.

DISCLOSURE OF THE INVENTION

The present invention has accomplished under the technical background such as described above and achieves the following purposes.

An object of the present invention is to provide a wiring board design system and a wiring board design method to determine a component and a wiring pattern in real-time when designing a wiring on a wiring board.

An another object of the present invention is to provide a real-time wiring board design system and a wiring board design method to draw a wiring while placing a component on a wiring board.

The present invention adopts the following means in order to achieve the above objects.

A wiring board design system of the present invention is a wiring board design system for designing a wiring board by arranging a component on a circuit board, wherein said system comprising: an information obtaining part for obtaining information concerning a single layer or a multiple layer said circuit board, said component having one or more connection terminal, and a wiring connecting said connection terminal of said component from an input means or selecting or obtaining from a memory means; a component arranging part for arranging said component input or selected by said information obtaining part in an appropriate position on said circuit board; a wiring processing part for determining a wiring route to said component or between said components arranged by said component arranging part; and a output part for outputting design data of said wiring board including said wiring route; wherein to determine by calculating said wiring route by said wiring processing part at every time of said arranging of said component or a plurality of said components arranged by said component arranging part.

The wiring board design system is characterized in that: wherein said wiring board design system comprising: a user terminal for performing designing said wiring board by being operated by a user; a server comprising of said information obtaining part, said component arranging part, said wiring processing part and said output part; and a communication network for providing data communication between said user terminal and said server.

When to determine said wiring route by calculating after said arranging of said component, if said component overlaps with said wiring which is determined beforehand, said wiring processing part secures a space for arranging said component by pushing out said overlapped wiring.

When to push out said wiring, said wiring processing part draws a figure of an ellipse or a quadrangle by the shape of said component at a specific distance of at least or more distance that does not affect said component from said wiring, obtains a cross point of a tangent line and said figure, said tangent line is drawn from a terminal of said wiring to said figure; draws a first new wiring from said cross point to said terminal; and draws a second new wiring between said cross points if a plurality of said cross points; and said first new wiring and said second new wiring becomes together said pushing wiring.

Said wiring processing part calculates the variation of ratio of all said wiring on said circuit board to an area of said circuit board, rotates said component or moves said arranging position of said component automatically so as to be the equal wiring density and said wiring processing is performed repeatedly.

Said wiring board design system comprising: a database storing data concerning constraints of said circuit board, said component and said wiring for use in designing of said circuit board.

A wiring board design method of the present invention is a wiring board design method for designing a wiring board by arranging components on a circuit boar, wherein said method comprising the next steps of: obtaining from an input means or selecting or obtaining from a memory means information concerning to wiring for connecting said a single layer or a multilayer circuit board, said component having one or more connection terminal, and, said connection terminal of said component; arranging said component, which is input or selected, in an appropriate position on said circuit board; determining a wiring route to said component arranged or between said components by a wiring processing part; and outputting design data of said wiring board including said wiring route.

The wiring board design method of the present invention is characterized in that: when to determine said wiring route by calculating after said arranging of said component, if said component overlaps with said wiring which is determined beforehand, a space for arranging said component is secured by pushing out said overlapped wiring by said wiring processing part.

And when to push out said wiring, said wiring processing part draws a figure of an ellipse or a quadrangle by the shape of said component at a specific distance of at least or more distance that does not affect said component from said wiring; obtains a cross point of a tangent line and said figure, said tangent line is drawn from a terminal of said wiring to said figure; draws a first new wiring from said cross point to said terminal; and draws a second new wiring between said cross points if a plurality of said cross points; and said first new wiring and said second new wiring becomes together said pushing wiring.

Said wiring processing part calculates the variation of ratio of all said wiring on said circuit board to an area of said circuit board, rotates said component or moves said arranging position of said component automatically so as to be the equal wiring density and said wiring processing is performed repeatedly.

The present invention affords the following effects.

The present invention makes it possible to determine a component and a wiring pattern in real-time when designing a wiring on a wiring board.

The present invention makes it possible to draw simultaneously wirings in real-time by arranging components on a wiring board.

Further, the present invention makes it possible to grasp accurately the situation of the wiring in course of the arrangement of a component by performing alternately or simultaneously the arrangement and the wiring on the circuit board.

BRIEF DESCRIPTION OF DRAWINGS

FIG. 3A is a conceptual diagram showing a component A and a component arranged on a circuit board and FIG. 3B is a conceptual diagram showing the process of pushing away the wirings when a component C is arranged additionally;

FIG. 4A is a conceptual diagram showing the component A and a component arranged on a circuit board and FIG. 4B is a conceptual diagram showing the process of arranging the component C additionally and wiring it;

FIG. 5A is a conceptual diagram showing the process of placing the multiple components on a circuit board and wiring them and FIG. 5B is a conceptual diagram showing the process of moving a component B1 and a component B2 simultaneously;

FIG. 6A is a conceptual diagram showing arranged components on the circuit board and FIG. 6B is a conceptual diagram showing a component B after rotated;

FIG. 17A is an example after a wiring calculation and FIG. 17B is an example after a fine adjustment after the wiring calculation.

BEST MODE FOR CARRYING OUT THE INVENTION

Figure 1:
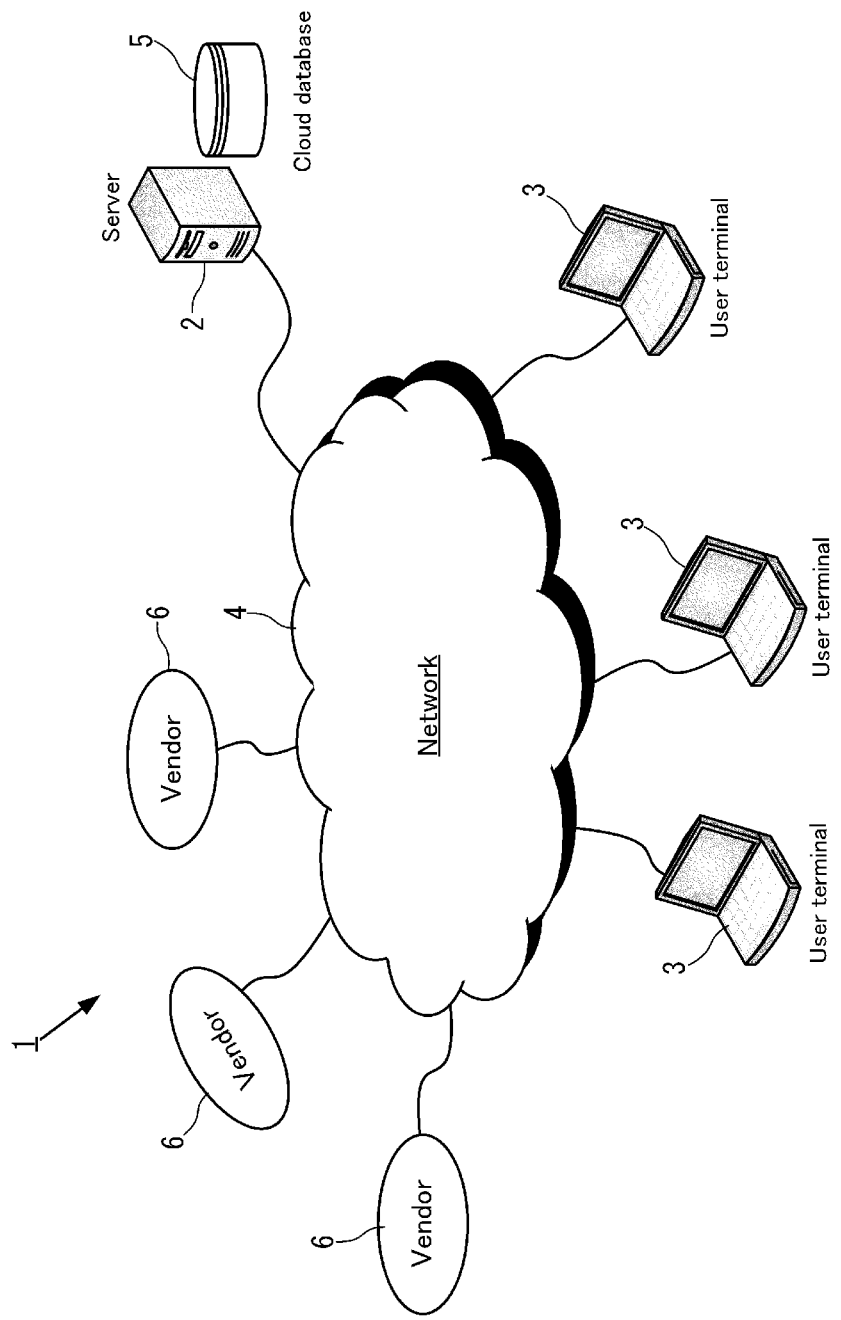
FIG. 1 is a conceptual diagram showing a summary of a wiring board design system 1 of a first embodiment of the present invention.

An outline of a wiring board design system 1 of a first embodiment of the present invention will be described with reference to drawings. FIG. 1 is a conceptual diagram showing an outline of the wiring board design system 1 of the first embodiment of the present invention. The wiring board design system 1 is a system for performing to design a wiring board by accessing a server 2 from a user operating a user terminal 3. The state of the design of the wiring board, its circuit board and the arrangement of components are displayed in a screen of the user terminal 3.

The user arranges the components on the board while viewing the detail of the wiring board design on the screen of the user terminal 3. The wiring is performed automatically when the component arranged on the circuit board and at last the arrangement position of the component is adjusted and processings such as the adjustment, the equalization and the like of the wiring density are performed. Especially, when a new component is arranged on the circuit board, a space for arranging the component is obtained on the circuit board by pushing out the wiring at its position automatically.

The wiring board design system 1 is basically a system comprising the user terminal 3 and the server 2, but the wiring board design is comprising plurality of functions necessary for the design as described in detail below. These functions are realized by an application software running on the server 2. In other words, the application software for the wiring board designing runs on the server 2 and the necessary functions for the wiring board designing is realized.

TERM DEFINITION

In the present embodiment, the circuit board means mainly a printed circuit board (PCB), but also include broadly a multiple chip module (MCM), an IC package, an LSI and the like. The circuit board means both a single layer circuit board comprising of a single layer and a multiple layer circuit board comprising of multiple layers which are overlapped. The single layer board is a structure which components and wirings are arranged in the same layer on the board and not being overlapped.

In the multilayer board, to arrange components and wirings on the same layer, when the wirings are overlapped anyway and it is necessary to cross the wirings, it is provided two or more layers and the wirings do not cross physically and are arranged three-dimensionally so as passing themselves up and down. Thus, in the multiple layer board, the wirings are mainly arranged in the multiple layers. The component involves electronic components such as a resistor, a coil, a capacitor, etc. and LSI. The wiring is a circuit line connecting components with each other and makes signals transmit by connecting the components electrically.

In addition, the wiring refers to a circuit line connecting a component and a connection terminal. The arrangement of a component means to arrange an electronic component and the like on the specific position on the circuit board. In the present example, the arrangement of the component includes a fine adjustment of the position by software when to arrange the component. In this example, in the component arrangement, the user clicks a mouse on an icon indicating the component while viewing the display of the user terminal 3 and arranges it on the specific position of the circuit board by a drag-and-drop operation. However, in the component arrangement, the user moves a cursor to a specific position on the circuit board while viewing the display of the user terminal 3 and the component may be arranged by a specific operation.

This specific operation can be an operation of an internal or a peripheral device of the user terminal 3 such as a key operation operating a specific one or two or more keys, a mouse operation, a touch panel operation and the like of the user terminal 3. Further, the arrangement of component includes arranging on the circuit board by batch processing by designating its arranging position, in other words, coordinate, according to a component list created beforehand. Thus, the arrangement of component is preferable that is without placing a burden on the user and can be operated intuitionally by the user.

[Outline of the Wiring Board Design System]

Figure 2:
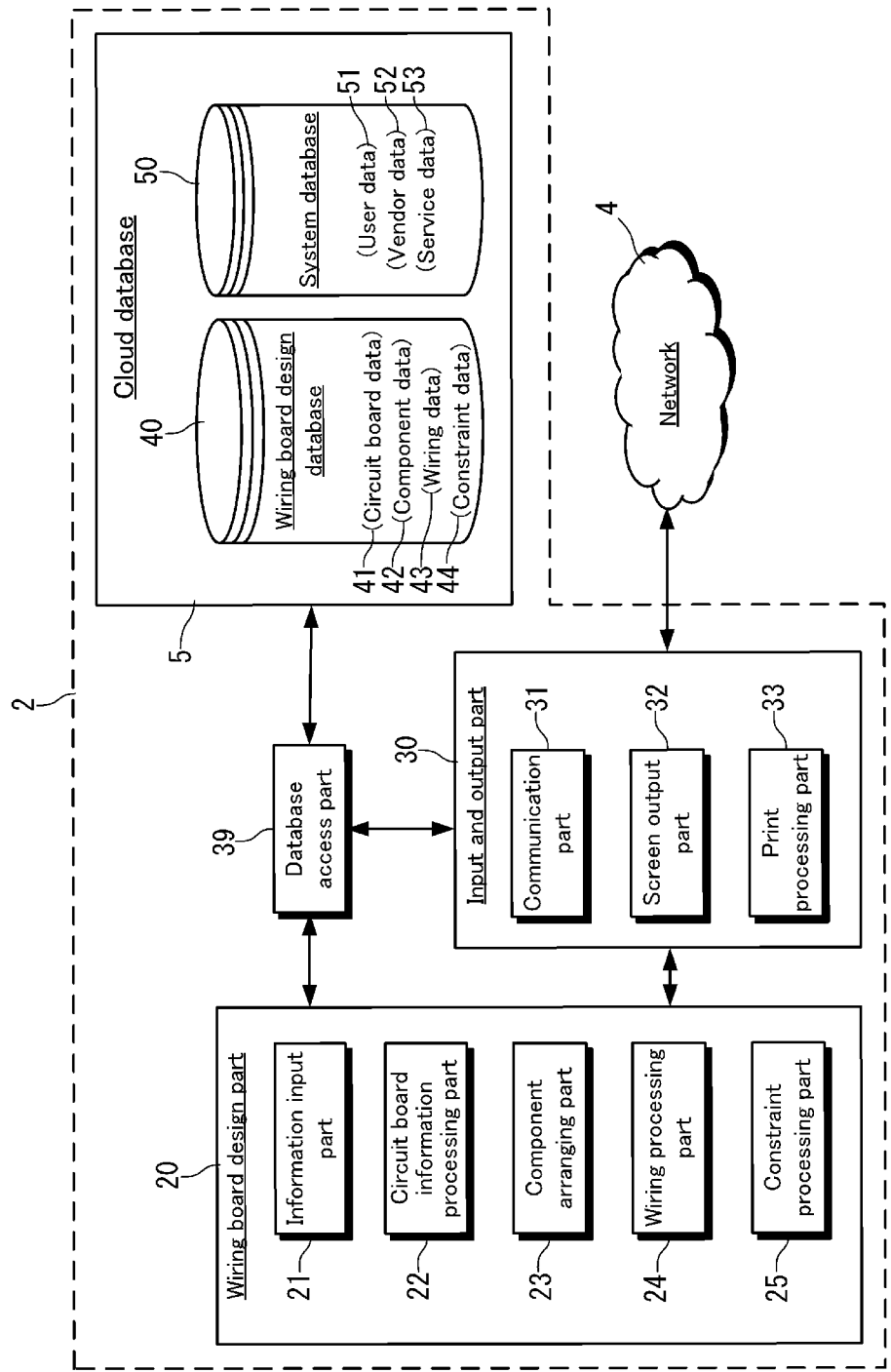
FIG. 2 is a block diagram showing a configuration of a server 2 of a wiring board design system 1 of a first embodiment of the present invention.

FIG. 1 is a block diagram showing the outline of the wiring board design system 1 of the first embodiment of the present invention and FIG. 2 is a block diagram showing the configuration of the wiring board design system 1. As shown in FIG. 1, the wiring board design system 1 is comprising of the server 2, the user terminal 3, and a network 4 providing the communication between them. The server 1 has a cloud database 5. The cloud database 5 can be stored in an independent database server, but in this example, it is stored in the server 2.

The network 4 is any network such as a wireless and/or wired Local Area Network, the Internet, etc. In this example, network 4 is described as the Internet as an example. A vendor 6 is a manufacturer, a seller and the like handling components, circuit boards, etc. necessary for the wiring board design. The vendor 6 accesses the server 2 via the network 4, references data concerning components, wirings, circuit boards, etc., stored in the cloud database 5, provides data about them and stores them in the cloud database 5.

The vendor 6 receives wiring board design data designed by the wiring board design system 1 from the server 2 or the user terminal 3, and receives orders for manufacturing the circuit board based on these wiring board design data. The user terminal 3 is a general-purpose electronic computing machine having a central processing unit, a memory, an output device, an input device, etc. The user terminal 3 has communication functions for wireless communication or wired communication to the network 4. The user accesses the server 2 by operating the user terminal 3 and designs the wiring board using a service provided by the wiring board design system 1.

As shown in FIG. 2, the server 2 of the wiring board design system 1 of the first embodiment of the present invention is comprising of a wiring board design part 20, an input and output part 30, a cloud database 5, etc. The cloud database 5 is a database storing necessary data for the wiring board design and comprising of a wiring board design database 40, a system database 50, etc. The wiring board design database 40 is comprising of board data 41 comprising of type, dimension, standard, etc. of the board; a component data 42, comprising of type, dimension, standard, constraint data, etc. of components; a wiring data 43, comprising of type, dimension, standard, etc. of wiring; a constraint data 44, comprising of constraint information related to circuit board, components, wiring, etc.

The system database 50 is comprising of: a user database 51 comprising of specific information such as name, user name, password, access permission of a user using the wiring board design system 1, data created by the user using the wiring board design system 1 and the like; a vendor database 52 comprising of information related to a manufacturer of a board, a component, a wiring and a maker manufacturing the designed circuit board; a service database 53 comprising of communication information, access information, encryption/decryption information, etc. of a service provided by the wiring board design system and the like.

The server 2 has a database access part 39 to provide an access to the cloud database 5. Especially, the wiring board design part 20 receives necessary data from the wiring board design database 40 via the database access part 39. The wiring board design part 20 comprises of an information input part 21, a circuit board information processing part 22, a component arranging part 23, a wiring processing part 24, a constraint processing part 25, etc. for realizing chain functions necessary for the wiring board design. The information input part 21 is a part for inputting data about a circuit board, a component and the like according to an instruction of the user terminal 3.

Also, the information input part 21 obtains necessary data from the cloud database 5 based on this input data. The information input by the information input part 21 is always sent to a screen output part 32 (explained later), and conversed to data available to display, and is provided to user terminal 3. The board information processing part 22 is a part for processing information related to the circuit board based on the circuit board information input by the information input part 21. The component arranging part 23 is a part for arranging components on the circuit board.

The components are arranged on the board based on the information related to the components input from the information input part 21. The wiring processing part 24 is a part for wiring processing of the components arranged by the component arranging part 23. The wiring processing part 24 and the component arranging part 23 can be processed simultaneously. The component arrangement part 23 is continuously monitoring whether the wiring is in the position to be arranged the component, in this situation, is processing in parallel with the wiring processing part 24 and the wiring is pushed out from the arrangement position of the component. This processing will be described below in detail.

The constraint processing part 25 is a part for a calculation processing whether each of the constraint of the circuit boards, the component and the wiring and the circuit board are met the specific conditions and reports the calculation results. If necessary, the constraint processing part 25 is comprising of a function to recalculate by sending an instruction to the board information processing part 22, the component arrangement part 23, the wiring processing part 24, etc. Also, in some cases, the constraint processing part 25 can change the component or designate an appropriate component by giving an instruction to the constraint processing part 25 or the information input part 21. The input and output part 30 is comprising of a communication part 31, a screen output part 32, a print processing part 33, etc.

The communication part 31 controls the data communication between the user terminal 3 and the server 2. The screen output part 32 generates data for displaying on the screen of the electronic computing machine, especially, the data for displaying on the screen of the user terminal 3. This screen data is sent to the user terminal 3 via the communication part 31 from the screen output part 32. The printing processing part 33 is a part to generate printing data from the wiring board design data that can be printed by a printing means, such as a printer, etc. The generated printing data is sent to the user terminal 3 or the vendor 6 via the communication part 31 from the print processing part 33.

The vendor 6 accesses the cloud database 5 via this communication part 31 and further via the database access part 39. As the circuit board for designing becomes complex by increasing number of components and wirings, for the processing for the wiring board design needs a huge amount of calculation. Therefore, the wiring board design system 1 can be realized by a stand-alone software operating on a general-purpose electronic computer, and also as above-mentioned, the wiring board design system 1 is preferably a network system.

By using this kind of network system, the user and/or the vendor can share resources related to the wiring board design processing, a wiring board design processing, etc. A plurality of users using a plurality of user terminals 3 share this wiring board design system 1 and can design a wiring board. One software is no longer used by one user terminal as conventionally, but now one system can be shared by plurality of users, therefore, users can design a wiring board at low cost as a result.

In the wiring board design system 1, especially, a cloud technology, spreading widely in recent years, is used. As above-mentioned, in the present embodiment, the wiring board design system 1 of the present invention realizes a cloud system based on the "Software as a Service" concept. The server 2 is a general-purpose server with a memory, a central processing unit, a communication function, etc. The server 2 is the core of the cloud system of the present embodiment and all the wiring board design is generally performed on the server 2.

Many user terminals 3 are connected to the server 2 and number of wiring board designs are processed simultaneously. In this example, the server 2 is depicted only one in the figure, but also it can be comprised of multiple dedicated servers, shared servers, etc. As the server 2, a supercomputer having superiority computing power can be used. And for the calculation of wiring route, a high-speed computing algorithm can be used and a general-purpose computer can be used as a server 2 and the wiring board design system 1 can be realized by a stand-alone computer.

[Wiring Example]

Figure 3A:
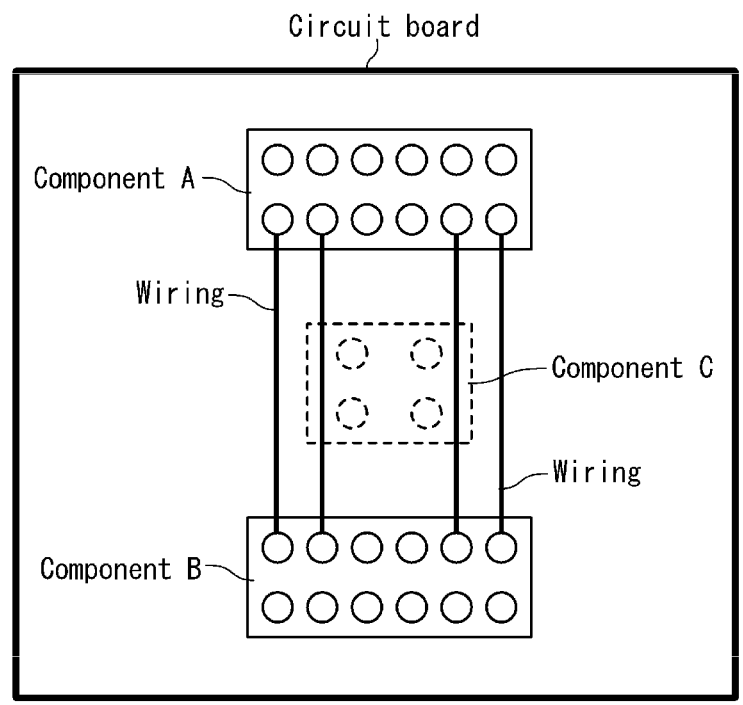
FIGS. 3A-B are explanatory diagrams explaining a summary of the technology used for a wiring board design in a wiring board design system 1 of a first embodiment of the present invention.
Figure 3B:
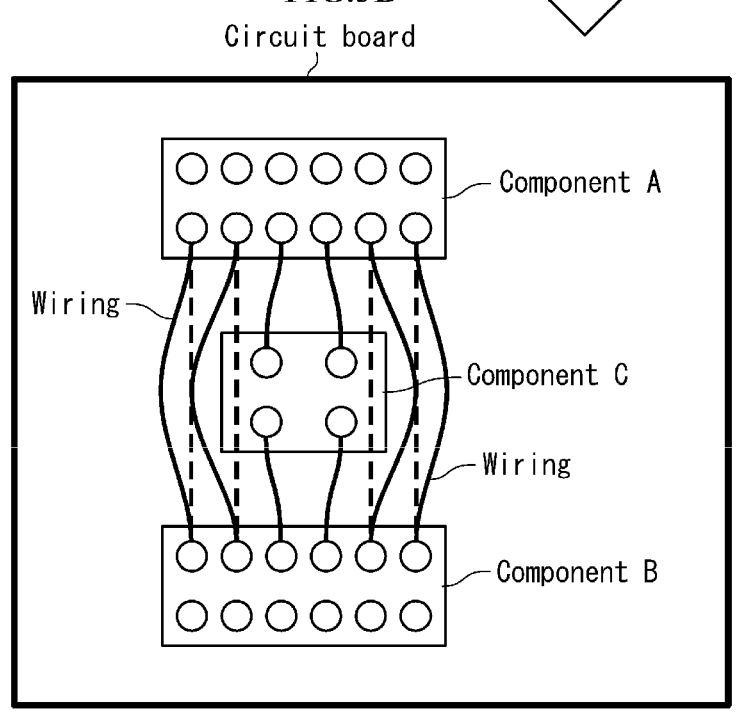

FIGS. 3A, 3B, 4A, 4B, 5A, 5B, 6A and 6B are conceptual diagrams showing situations of the wiring board design performing automatically wiring processing after arranging components on the circuit board. In the wiring board design system 1, FIGS. 3A and 3B are exemplary figures explaining the technology used in the wiring board design. As shown in FIG. 3A, after arranged the component A and the component B on the circuit board, the wiring processing is performed and the component A and the component B are connected by appropriate wirings. These wirings are depicted by solid lines in FIG. 3A.

This solid wiring line connects the appropriate terminal of the component A with the appropriate terminal of the component B (Below are the same). After that, the component C is arranged on the appropriate location on the circuit board. As shown by the dashed line in FIG. 3A, the arrangement position of the component C is drawn between the component A and the component B. The component C cannot be entered completely within the wiring lines connecting the component A with the component B, the wiring of the solid line and the component C are overlapped. The wiring processing part 24 (See FIG. 2) calculates the wiring, and pushes out the wirings until obtaining a gap in that the component C can be entered, between the wirings.

The wiring lines connecting the component A with the component B becomes curve as shown by the solid line in FIG. 3B finally. In FIG. 3B, the wiring of the solid line in FIG. 3A is depicted by a dashed line. When the position of the component C is determined by the component arranging part 23, the wiring processing part 24 automatically calculates the entire wiring of the circuit board. By this, the component C is wired to the component A and the component B respectively. As shown in FIG. 3B, the dashed wiring lines connecting the component A with the component B is pushed out to the both sides of the circuit board and becomes solid curves.

Like this, the present invention performs wiring processings immediately after the arranging the components. Therefore, it is understood the wiring conditions of the whole circuit board in each placement of the components and it is easy for the user to grasp where to place the next component. Obviously, it is performed a fine adjustment, optimizations of the wiring, etc. by moving or rotating the component C on the spot. The details are explained below.

Figure 4A:
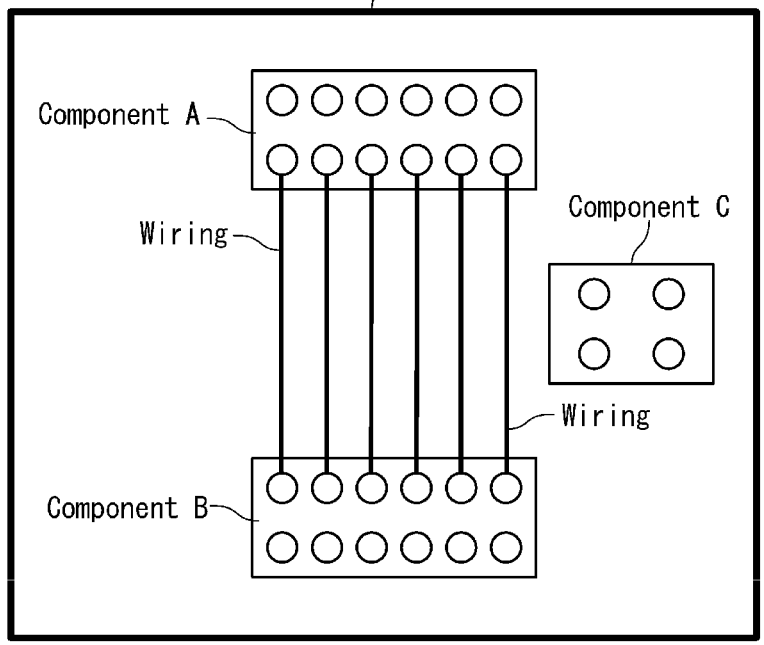
FIGS. 4A-B are explanatory diagrams showing an example of arranging a component C next to a component A and a component B.
Figure 4B:
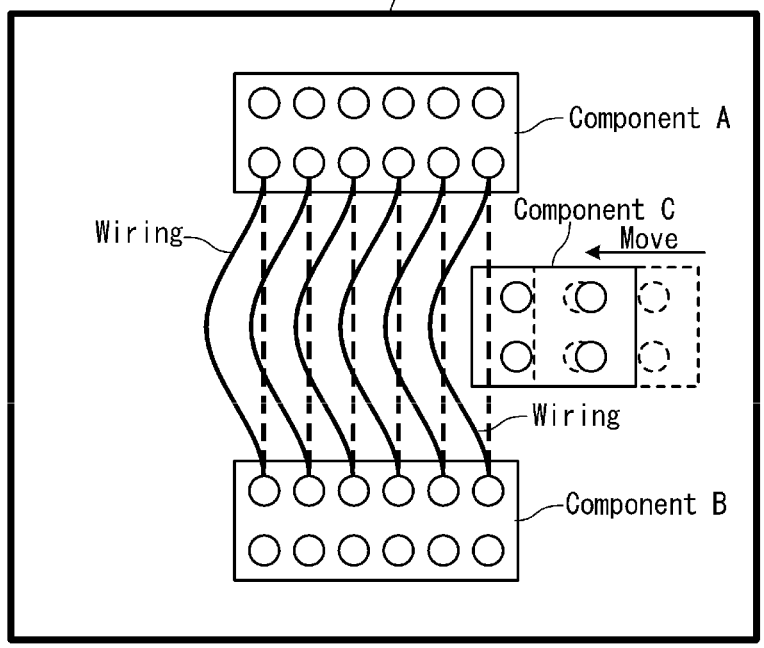

FIGS. 4A and 4B are conceptual diagrams showing an example of arranging the component C next to the component A and the component B. FIG. 4A is a conceptual diagram showing a situation that the component A and the component B are arranged on the circuit board. FIG. 4B is a conceptual diagram showing a situation that the component C is arranged by adding them. In other words, it is an example arranging the component C not between but next to the component A and the component B. The component C is moved so as some of it can enter between the component A and the component B. The component C arranged additionally is drawn by solid lines in FIG. 4A and this is drawn by dashed line in FIG. 4B.

Then, as shown by the arrow in FIG. 4B, the component C is moved so as it can be entered between the component A and the component B. The component C is pushing out the wiring connecting the component A and the component B, after entered between the component A and the component B. The wiring is pushed out and it becomes the curve drawn by the solid line from the original wiring drawn by the dashed line. Therefore, the component C is arranged without overlapping the wirings.

Figure 5A:
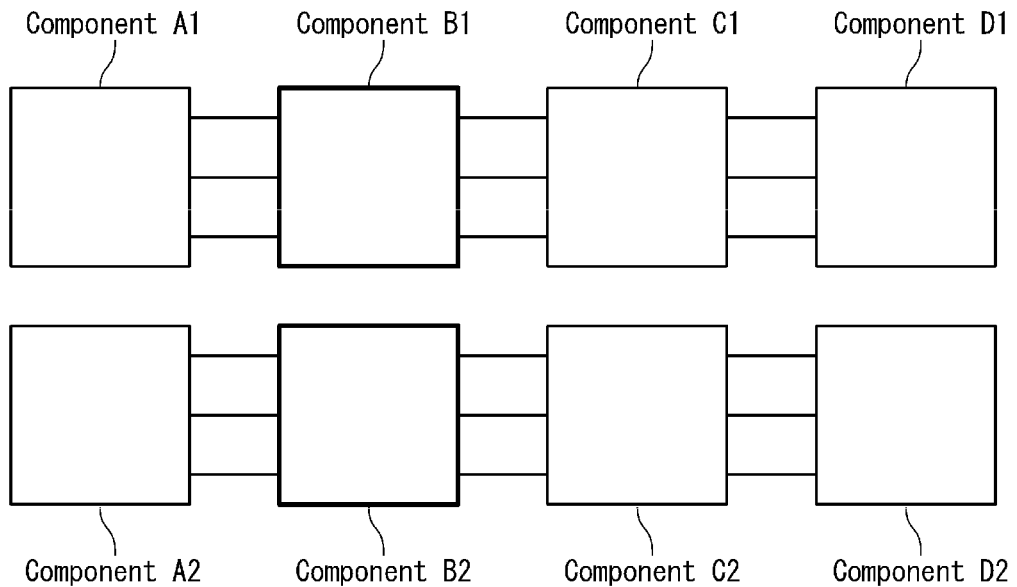
FIGS. 5A-B are explanatory diagrams illustrating an example of moving multiple components of arranged components.
Figure 5B:
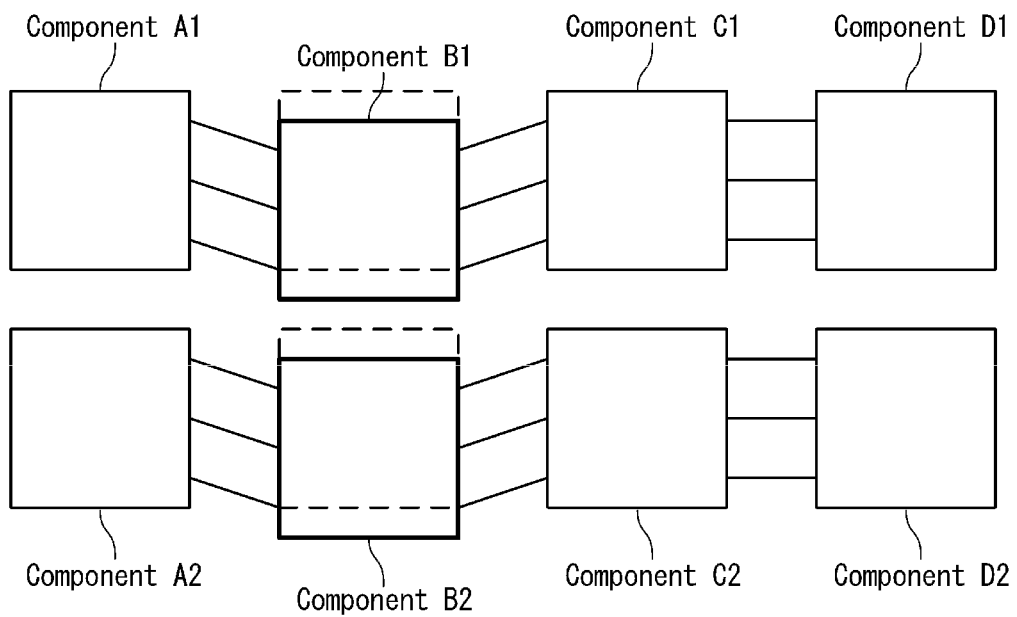

FIGS. 5A and 5B are conceptual diagrams showing a situation that plural components are moved. FIG. 5A is a conceptual diagram showing by the solid line a situation that the plurality of components A1-D1, A2-D2 are arranged and wired on the circuit board (not shown). Here, the connection terminals of the components A1-D1, A2-D2 are not shown and the connecting states are shown conceptually. In order to move the component B1 and the component B2 simultaneously, the component B1 and the component B2 are selected and these component B1 and component B2 are being shown by a thick highlighted line.

Figure 6A:
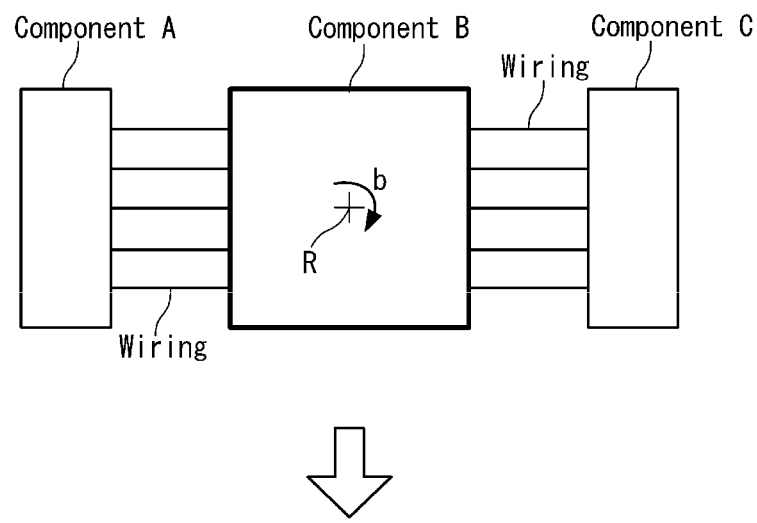
FIGS. 6A-B are explanatory diagrams showing the process rotating a component on a circuit board.
Figure 6B:
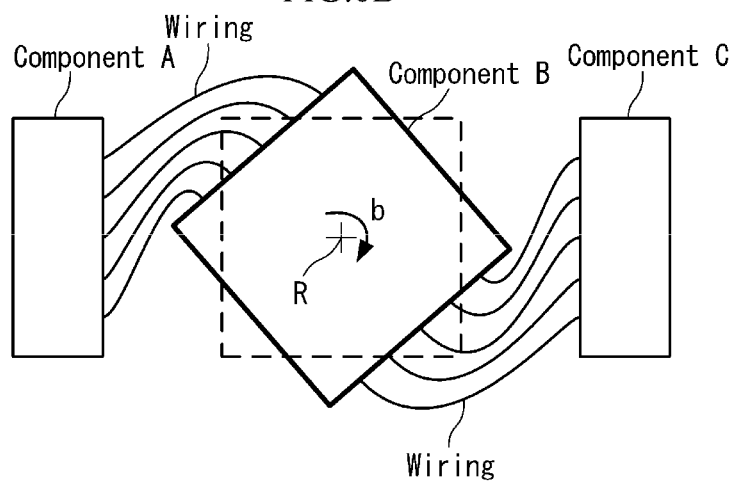

FIG. 5B is illustrating the situation after that the component B1 and the component B2 are moved. The original locations of the component B1 and the component B2 are illustrated by dashed lines. In this FIG. 5B, the dashed lines connecting the component B1 with the component A1 and the component C1 are illustrated by the solid lines. The component B2 is the same. FIGS. 6A and 6B are conceptual diagrams showing a situation that components are rotated on the board. As shown in FIG. 6A, the component A, the component B and the component C are arranged. First, the arrow b illustrates the direction to rotate the component B by the center point of the component B.

The wiring is illustrated by the solid lines. In FIG. 6B, the situation after the rotation of the component B is illustrated and the position of the component B before the rotation is illustrated by the dashed line. By this rotation, the wiring connecting the component B with the component A and the component C becomes curves. Thus, the wiring board design system 1 of the present invention is an integrated system performing a flowplan showing layers, its arrangement and the wiring when designing the circuit board. Since the arrangement and the wiring of the component are performed simultaneously, the component arrangement and the wiring can be performed entirely again even during the design calculation of the circuit board.

Therefore, by calculating while arranging components on intended position by the user, the wiring is completed at the same time with the completion of the component arrangement. As mentioned above, the wiring work did not start after finished arranging components on the circuit board, but the wiring process starts automatically every time when a component is placed on the circuit board one by one. Because the wiring of the components arranged in real-time in this manner, it is found instantly and accurately whether in which part of the board the wiring density is high or has a space. Thereby, a qualitative indicator, which determines on where of the board the next component should be arranged, can be obtained.

[An Optimization Example of Wiring]

Figure 7:
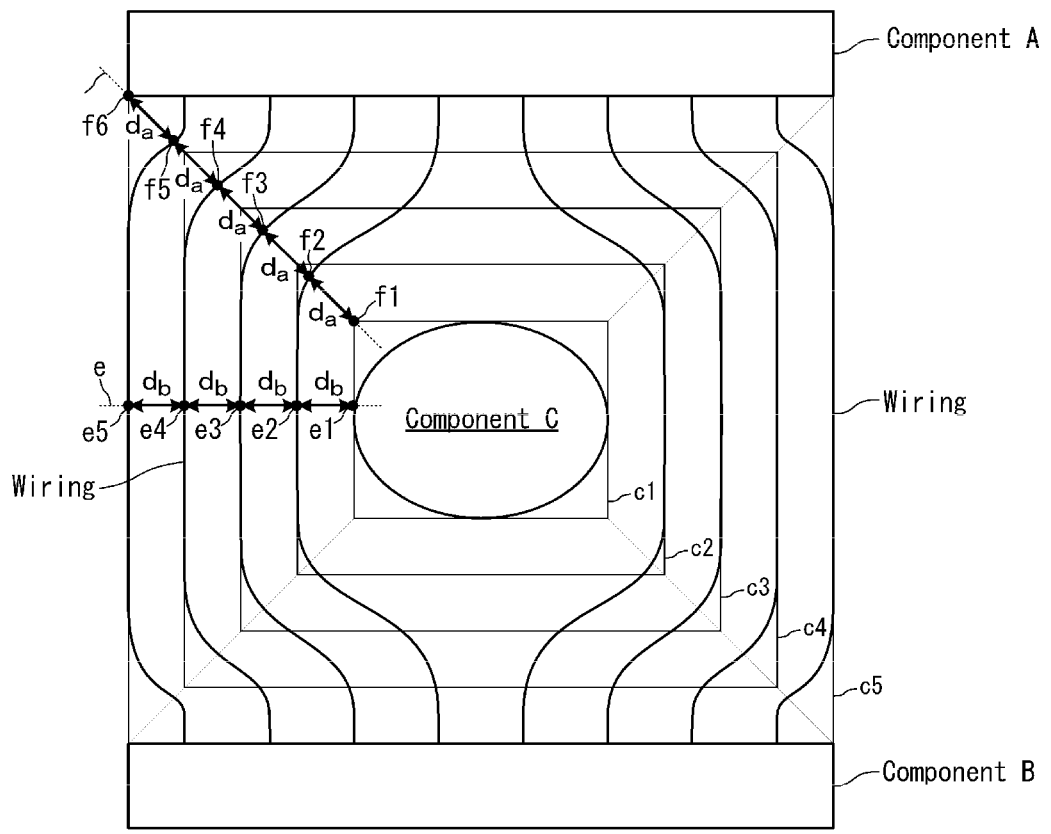
FIG. 7 is a conceptual diagram showing an example of calculating wiring when arranging a component on a circuit board additionally.

FIG. 7 is a conceptual diagram showing an example of calculating the wiring when to arrange the component C between the component A and the component B. Basically, when the arrangement position of the component C is determined, the wiring between the component A and the component B is pushed out and a space for placing the component C is formed. In this example, the component C is arranged in the middle of the component A and the component B. For wiring in the circuit board design, there are various constraints concerning signals transmitting through it, characteristics of electronic components surrounding it and the like.

First, one of them is an interval between adjacent wirings. Data showing wiring constraint is stored in a wiring board design database 40 of the cloud database 5, especially, in a constraint data 44, etc. (See FIG. 2). In the present example, the adjacent wirings are adjusted so as the equal interval with each other. As shown in FIG. 7, the interval between the wirings is a distance $d_b$. The distance $d_b$ must be a least value or more of the constraints of the circuit board design. In the example shown in FIG. 7, the component A and the component B are connected by 8 wirings and 4 wirings are placed on each side of the component C.

The wiring is connected in equal interval and vertically with the component A and the component B. The component C is virtualized by the quadrangle C1 to simplify the wiring calculation. Each side of the quadrangle C1 has the same length with the major axis and the minor axis of the component C. As shown in FIG. 7, the wiring pushed out is arranged on the side of the quadrangles C2-C5. Because the component C is arranged in the center of the wirings, the quadrangles C2-C5 are a half number of the all wirings arranged.

Since the center point of the quadrangles C1-C5 is overlapped basically with the center point of the component C, each side of the quadrangles C1-C5 is parallel and its lengths are different, it becomes an embedded structure. The distance of each side of the quadrangles C1-C5 has the minimum constraint length of the circuit board design or more.

In FIG. 7, this distance is $d_b$. The line e shown in FIG. 7 is a straight line perpendicular to the short side of the quadrangles C1-C5. Points e1-e5 on the line e are the points crossing the short sides of quadrangles C1-C5 with the line e and the adjacent points e1-e5 have the same interval of length $d_b$.

The quadrangle C5, the biggest quadrangle, is a quadrangle so as to overlap one side of the component A and the component B. The wiring is wired between the component A and the component B basically. The wiring is wired between the component A and the component B as much as possible even when the component C is arranged between the component A and the component B. However, when distance $d_b$ is shorter than the length of the minimum constraint length of the board design, to make the length $d_b$ to the minimum constraint length of the board design or more and the largest component of the quadrangle C5 may be protrude between the component A and the component B. The point f1 and the point f6 showed in FIG. 7 are angles of the quadrangles C1 and C5 of the smallest and the biggest angles, and the straight line f passes these 2 points.

The part of the straight line f between the points f1 and f6 is divided into 5 equal parts, each part has a length $d_a$. This $d_a$ locates where the wiring goes through and has the minimum or longer length than the minimum constraint length of the circuit board design constraint. The wiring goes through the sides of the quadrangles C2-C5, and goes through points f2-f4, and is connected to the component A gradually. Although such a wiring way is explained only about the straight line f going through the point f1 and the point f6, the straight line going through other 3 angles of the quadrangles C1-C5 is the same and the detailed explanation is omitted.

Example 1 of Algorithm for Pushing Out Wiring

Figure 8:
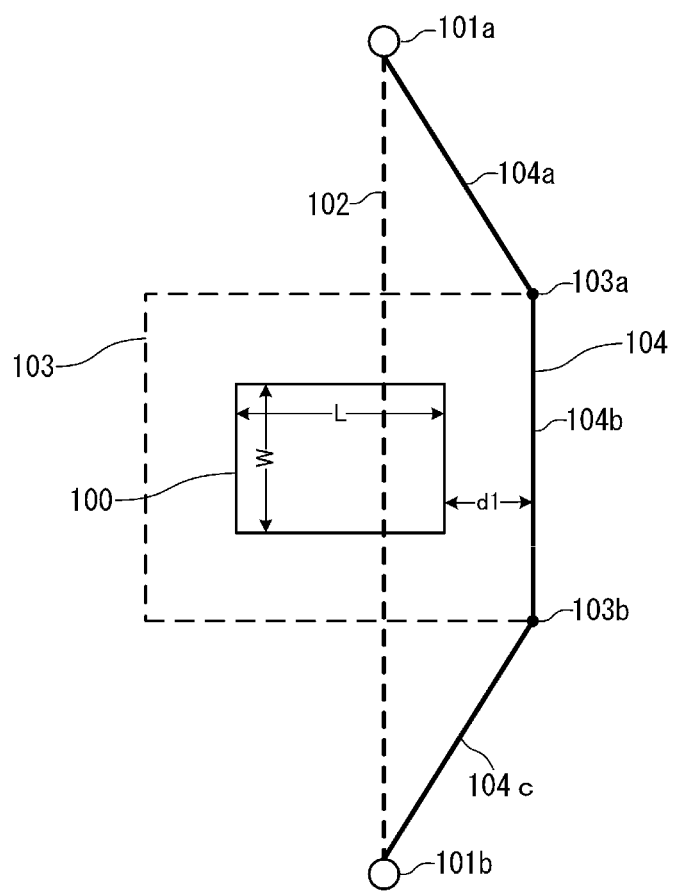
FIG. 8 shows an example 1 (quadrilateral component) acquiring space for arranging a component by pushing away wirings when wiring.

FIG. 8 is a figure showing an example 1 of a status acquiring a space for placing components pushing away wirings when wiring. In FIG. 8, the reference number 100 refers a component to arrange. The component 100 has a rectangle shape. The width of the component 100 is W, the length is L. The reference number 101a and 101b refer terminals of other components. The terminal 101a and the terminal 101b are the terminals of the component A and the component B drawn in FIGS. 5A, 5B, 6A and 6B and these 2 terminals are connected to the wiring 102.

The component 100 overlaps the component 102 when to arrange on the circuit board. There is a need to ensure a space for arranging the component 100 by pushing out the wiring 102. First, in this time, as shown in FIG. 8, a quadrangle 103 is drawn from each side of the quadrangle of the component 100 in specified distance d1. The specified distance d1 determined by the least distance depending on type and use of the component 100, the amount of current flowing the wiring, the amount of voltage, type and shape of the wiring, etc. The specified distance d1 must be a distance of a degree that does not affect the component 100 when a signal is flowing in the wiring.

After determining the quadrangle 103, the point 103a and the point 103b of the angle are determined. Then, the wiring 104a is drawn from the terminal 101a to the terminal 103a. Further, the wiring 104 is drawn from the point 103a to the point 103b. At last, the wiring 104c is drawn from the point 103b to the point 101b. As the result, the drawn wiring 104a, 104b and 104c become the wiring 104 together and it connects the terminal 101a and the terminal 101b. The wiring 104 is apart a distance d1 at least from the component 100 and the influence of the current flowing in this wiring does not affect the component 100.

At last, not shown in Figure, a distance from each point of the wiring 104 to another component or a wiring existing around them is calculated and it is determined whether affect them. By this determination, if the distance could not affect, the wiring 104, drawn by pushing out the wiring 102, is successful. By this determination, if the distance could not affect, the wiring 104 is inadequate. Therefore, the component 100 could not be arranged at this position. In this case, the arrangement of the component 100 is cancelled or it is necessary to rearrange the components or wirings influenced by the wiring 104 by moving away further from the component 100 and wiring 104.

Example 2 of Algorithm for Pushing Out Wiring

Figure 9:
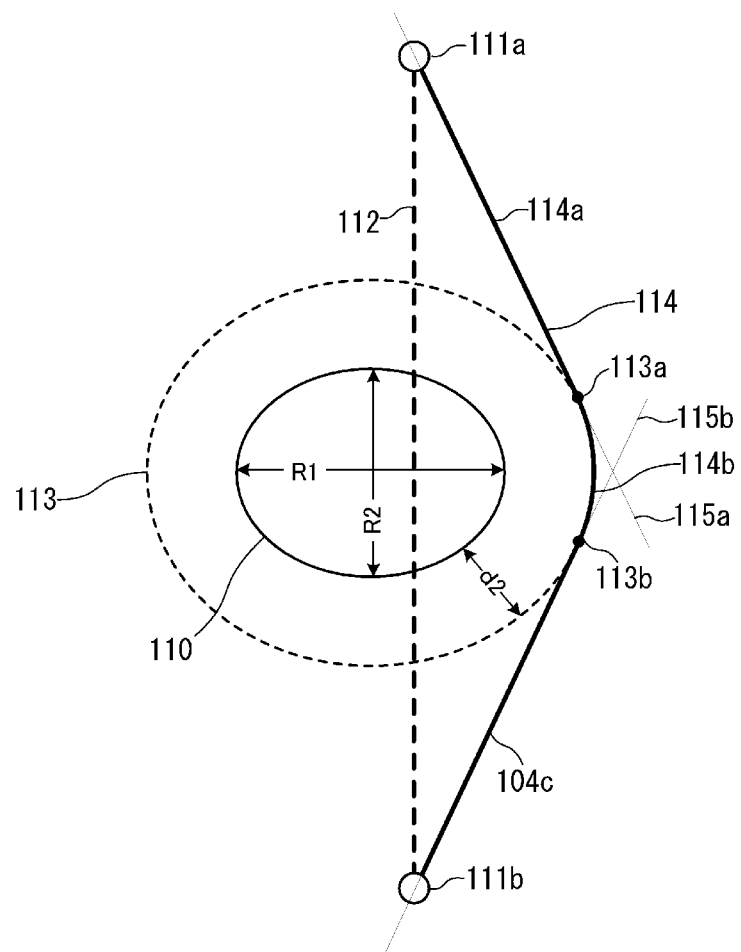
FIG. 9 shows an example 2 (elliptical component) acquiring space for arranging a component by pushing away wirings when wiring.

FIG. 9 is a figure showing an example 2 of a status acquiring a space for placing components by pushing away wirings when wiring. In FIG. 9, the reference number 110 refers a component. The component 110 has an elliptical shape. The ellipse has a radius R1 and R2 of the component 110. When R1 and R2 are equal, the component 110 becomes an orbicular. Reference numbers 111a and 111b are terminals of other components.

The terminal 111a and the terminal 111b are the terminals of the component A and the component B drawn in FIGS. 5A, 5B, 6A and 6B and these two terminals are connected by the wiring 112. The component 110 overlaps the component 112 when to arrange on the circuit board. There is a need to ensure a space for arranging the component 110 by pushing out the wiring 112. As shown in FIG. 9, the ellipse 113 is drawn in the specific distance $d_b$ from the component 110. The specific distance d2 is determined by type and use of the component 110, the amount of current flowing the wiring, the amount of voltage, type and shape of the wiring, etc.

The specified distance d2 must be a distance of degree that does not affect the component 110 when a signal is flowing in the wiring. After determining the quadrangle 113, a tangent 115a is drawn to the ellipse 113 from the midpoint of a terminal 111a. A contact point of a tangent 115a and the ellipse 113 is a point 113a. The same, a tangent 115b is drawn to the ellipse 113 from the midpoint of the terminal 111a and the contact point is a point 113b. Then, the wiring 114a is drawn from the terminal 111a to the terminal 113a. Further, the wiring 104b is drawn from the point 113a to the point 103b.

The wiring 104b becomes a curve as overlapping the ellipse 113. If this is done, the distance d2 can be secured. At last, the wiring 114c is drawn from the point 113b to the point 111b. As the result, the drawn wiring 114a, 114b and 114c become the wiring 114 together and it becomes a wiring connecting the terminal 111a and the terminal 111b. The wiring 114 is apart a distance d2 at least from the component 110 and the influence of current flowing in this wiring does not affect the component 110.

A distance from each point of the wiring 114 to other components (not shown in Figure) or wirings (not shown in Figure) existing around them is calculated and it is determined whether affect them. By this determination, if it was a distance cannot effect, the wiring 114, drawn by pushing out the wiring 112, is successful. By this determination, if the distance could not affect, the wiring 114 is inadequate. Therefore, the component 110 cannot be placed in this position. In this case, it is necessary to cancel the arrangement of the component 110 or to rearrange the components or wirings influenced by the wiring 104 by moving away further from the component 110 and wiring 114.

Example 3 of Algorithm for Pushing Out the Wiring

Figure 10:
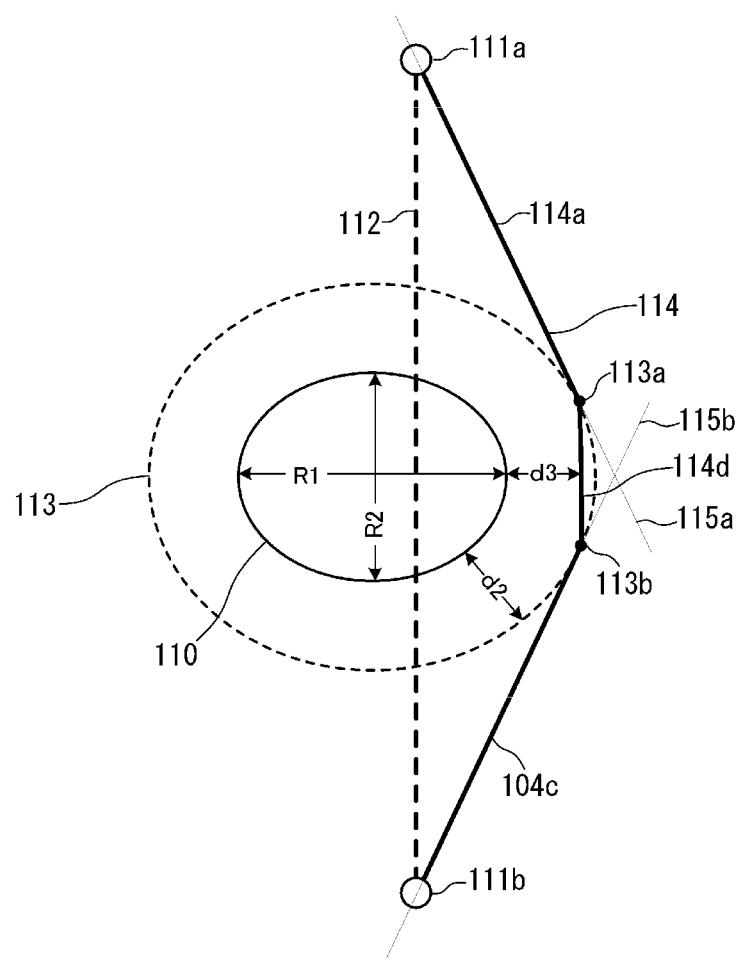
FIG. 10 shows an example 3 (elliptical component) acquiring space for arranging a component by pushing away wirings when wiring.

FIG. 10 is a figure showing an example 3 of a status acquiring a space for placing components pushing away wirings when wiring. The example shown in FIG. 10 is basically the same with FIG. 9, but the point 113a and the point 11b are connected by the straight line 114d. The drawn wiring 114a, 114d and 114c become together the wiring 114 and is the wiring connecting the terminal 111a and the terminal 111b. The distance d3 is calculated by calculating the distance between this wiring 114 and the component 110.

It is confirmed whether the distance d3 is over the least distance that does not affect the component 110. If the distance d3 is less than the least distance, the wiring is inappropriate, consequently, the processing pushing out the wiring must be redone by making the distance d2 longer. Or, the location of the component 110 is inappropriate and must be changed. If the distance d3 is the same or more than the least distance, it indicates that the processing of pushing out the wiring is successful.

At last, a distance from each point of the wiring 114 to other components (not shown in Figure) or wirings (not shown in Figure) existing around them is calculated and it is determined whether affect them. By this determination, if it was a distance can not effect, the wiring 114, drawn by pushing out the wiring 112, is successful. By this determination, if the distance could not affect, the wiring 114 is inadequate. Therefore, the component 110 cannot be placed in this position.

In this case, it is necessary to cancel the arrangement of the component 110 or to rearrange the components or wirings influenced by the wiring 104 by moving away further from the component 110 and wiring 114. As mentioned above, 3 examples of algorithm for pushing out the wiring are explained, and here components having complex shapes are considered. Basically, the least distance, which the wiring does not influence the component, is obtained, then an ellipse or a quadrangle is drawn around the component at a position at least the least distance away from the component. Since these ellipse and quadrangle can fit FIG. 8, FIG. 9 and FIG. 10, the wiring can be obtained as above-mentioned algorithms of examples 1-3.

Although, in these examples 1-2, a relatively simple example was described that there was no other components between the component A and the component B already arranged, the wiring decision becomes more complex if such components exist. However, in the concept of the present invention, when to arrange components, creates a space for arranging by pushing out the wirings already arranged, etc. and recalculates the wirings, the detailed explanation is omitted since a complex wiring depends on its calculation algorithm.

[Use Flowchart of the Wiring Board Design System 1]

Figure 11:
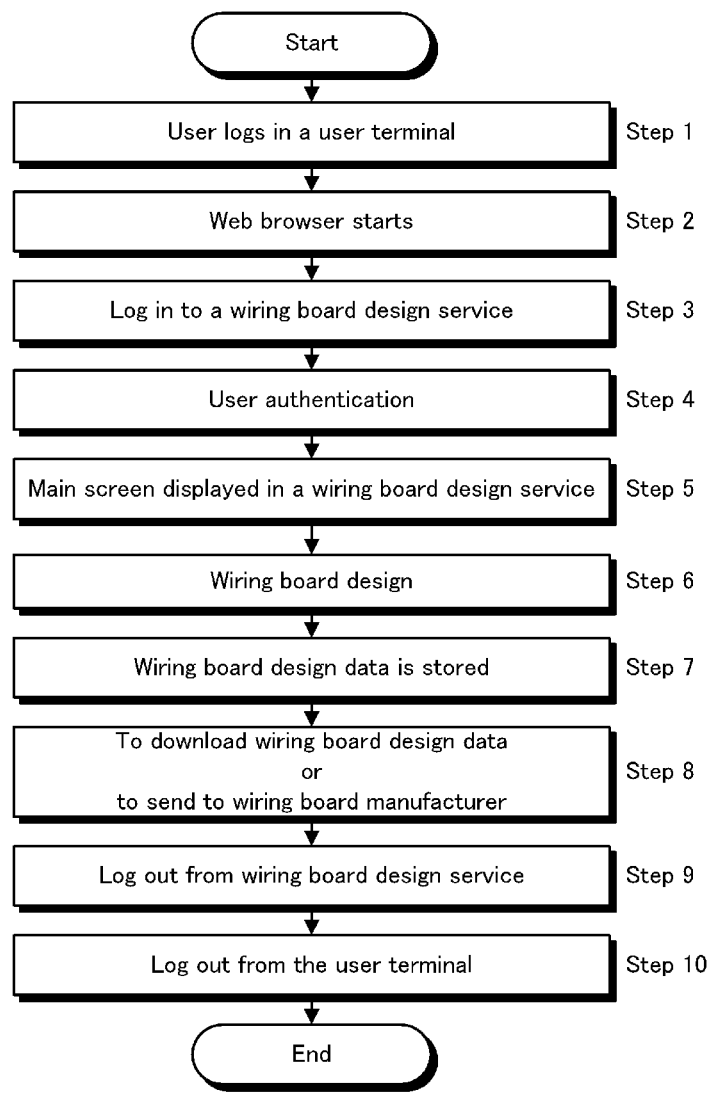
FIG. 11 is a flowchart showing an example of the procedure when a user uses a wiring board design system 1 of a first embodiment of the present invention.

FIG. 11 is a flowchart showing an example of a procedure for using the wiring board design system 1. The user designs the board using the wiring board design system 1 and obtains a blueprint. First, as shown in FIG. 1, the user uses the user terminal 3. The user logs in after started the user terminal 3 (Step 1). The user terminal 3 operates under the control of an operating system as a fundamental software.

The user terminal 3 accesses the server 2 via the network 4 and receives the wiring board design service provided by the server 2. The wiring board design service is performing all the wiring board design processing by the server 2 and provides services to the user through the user agent operating on the user terminal 3. The user terminal 3 has the user agent to provide an interface for the user. The user agent is a dedicated application software or a web browser that are developed for the wiring board design service.

In this example, the server 2 provides a web standard interface and it is explained as that the user terminal 3 uses the web browser as the user agent. As the operating system, it can be used arbitrary operating system. For example, Windows (Registered Trademark) operating systems provided by Microsoft Inc. of U.S.A., MAC OS (Registered Trademark) operating systems provided by Apple Incorporated Company of U.S.A., and UNIX, Linux, etc., is exemplified as a general-purpose operation system.

Also, an arbitrary browser can be used as the web browser. Mozilla Firefox, Google Chrome, Internet Explorer, Opera, Safari, etc. are exemplified as the web browser typically. The user starts the web browser on the user terminal 3 (Step 2), and inputs a URL address of the wiring board design system. Thereby, the login screen of the wiring board design service from the server is displayed on the web browser (Step 3). In this login screen, the user inputs a user name and a password.

In the server side, if the user authentication using this user name and the password is successful, the user can receive the wiring board design service (Step 4). Data stored in a system database 50, especially, the user data 51, and the like are used for the user authentication. In the web browser, a main screen (not shown) showing a list of services, the user can receive, is displayed (Step 5), and the user selects an appropriate service from these services.

One of these is the wiring board design service (Step 6). The design of the wiring board is finished after performing the wiring board design using the wiring board design service, then the used data, the wiring board design data which is the result of the wiring board are stored (Step 7). The user can download the stored wiring board design data into the user terminal 3 (Step 8). Or, it can be sent directly from the server 2 to the vendor 6 of the board manufacturer, concerned parties, etc. (Step 8). At last, the user log out from the wiring board design system (Step 9). Then, the user terminates the web browser and log out from the user terminal 3 (Step 10).

Figure 12:
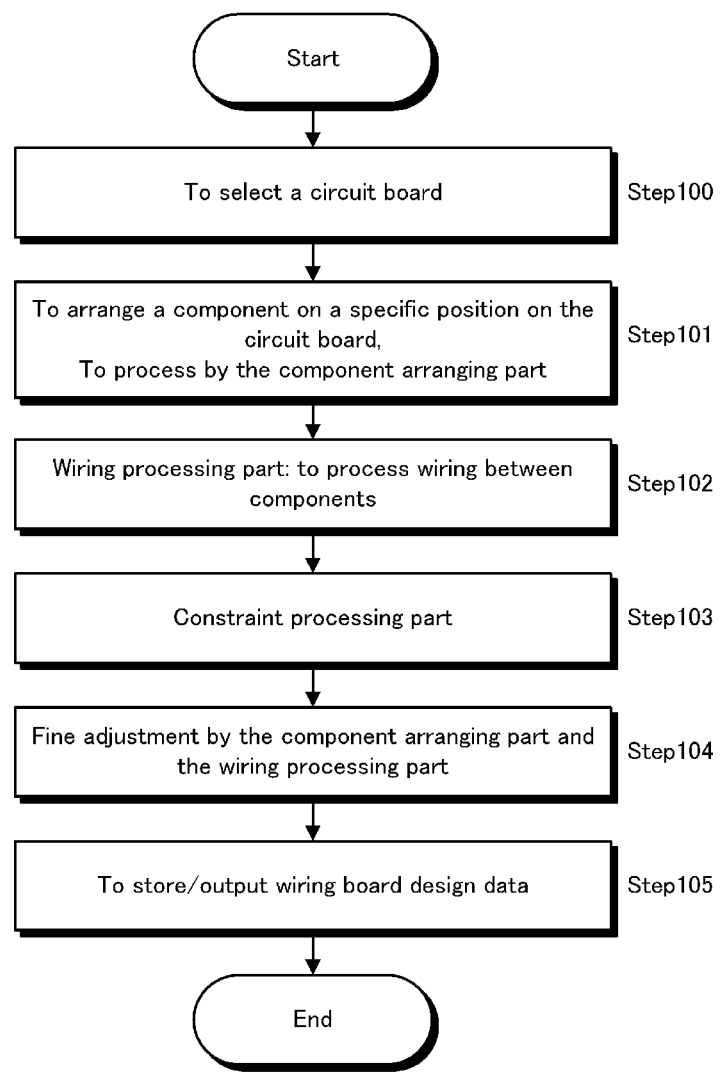
FIG. 12 is a flowchart showing the entire procedure for designing a wiring board of a wiring board design system 1 of the present invention.

FIG. 12 is a flowchart showing the entire procedure of designing a wiring board. First, the circuit board is selected (Step 100). While viewing the screen of the user terminal 3, the user selects from a circuit board list of the wiring board design service or inputs conditions relating to a circuit board and the circuit board is selected. When selecting the circuit board, type, size, constraint information, etc. of the circuit board are selected or input. If necessary, the user inputs necessary information. The circuit board information processing part 22 (See FIG. 2) processes these information about the circuit board and performs the optimization of the circuit board.

When the selection of the operation of the circuit board information processing part 22 is finished, the user selects the components and arranges them at the predetermined position on the circuit board (Step 101). The selection of the components can be performed by each component or plural components in a lump. The arrangement of components is processed by the component arranging part 23 (See FIG. 2). When the component is arranged, the wiring processing part 24 (See FIG. 2) operates to perform the arrangement of the components with the wiring processing simultaneously (Step 102). The wiring processing part performs wiring processings as the examples shown in above FIGS. 3A, 3B, 4A, 4B, 5A and 5B.

The user mainly specifies to connect the terminal of the component to a terminal of which component. However, if there are general-purpose circuits or precedent examples, because these data are stored in the cloud database 5, these information can be used. In other words, based on these information, the wiring processing part 23 gets the user's approval of that connects automatically terminals of components with terminals of components or showing connection states. When the wiring processing is finished, the constraint processing part 25 (See FIG. 2) operates and compares the wiring design data to various constraint information (Step 103).

If necessary, the component arranging part 23 and the wiring processing part 24 can redo the fine adjustment again (Step 104). Then, if necessary to arrange components additionally, above-mentioned Steps 101-104 are repeated. When the wiring board design finished, the wiring board design data which is the result thereof is stored in the cloud database 5. Or, when the wiring board design finished, the wiring design data is processed by the print processing part 33, is conversed into printable file, is sent is to the user terminal 3 or is output to a print device.

[Wiring Processing Part]

Figure 13:
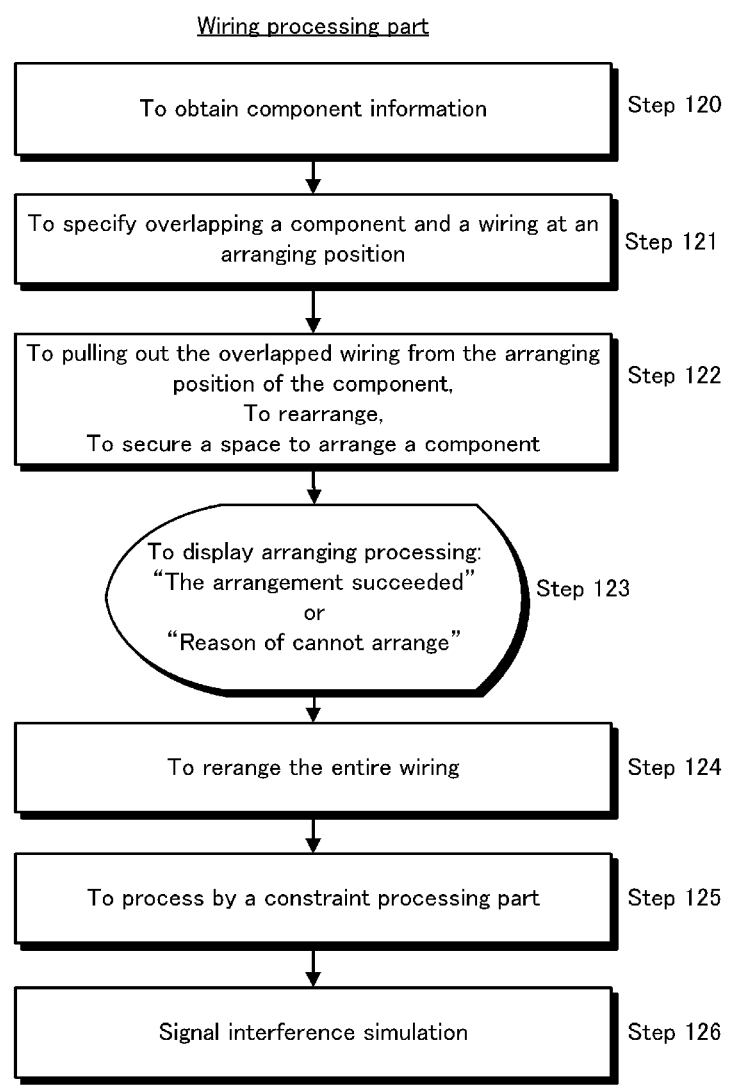
FIG. 13 is a flowchart showing an operation example of a wiring processing unit 24 of a wiring board design system 1 of the present invention.

FIG. 13 is a flowchart showing an operation example of a wiring processing part 24. The wiring processing part 24 obtains data concerning to the arrangement of the components from the component arranging part 23 (Step 120). The data to obtain are type, size of the component, terminal data, the arrangement of the component, etc. The wiring processing part 24 confirms whether other wiring is on the circuit board at the arranging position of the components and specifies the overlapping of the component and the wiring (Step 121).

Based on these information, the wiring processing part 24 gets the user's approval of that connects automatically terminals of components with terminals of components or showing connection states. When the component and the wiring are overlapped, a space that can arrange the component is ensured by pushing out laterally the wiring on the circuit board. Then, the situation of the wiring processing of the component is displayed (Step 123). In this situation display, here displayed "Successful arrangement" which refers the component arrangement succeeded, "Reasons for can not arrange" which refers the reasons if could not arrange, etc.

After that, the component arranging part 23 reexamines overall wirings on the circuit board, specifies areas which having the wiring density too high and rearranges the wiring so as to have the wiring density be as equal as possible (Step 124). When it could not have the equalization of the wiring density only by the wiring processing, it informs a notification about movement of the components to the component arranging part 23 and the component arranging part 23 receives this and performs the fine adjustment and the movement of the component arrangement. After that, the wiring processing part 24 performs again the wiring processing, the wiring density equalization, etc.

Then, the constraint processing part 25 calculates various constraints according to the entire circuit board and the arrangement of the components (Step 125). At last, the constraint processing part 25 performs a signal interference simulation (Step 126), verifies functions and reliability of the designed circuit board. The signal interference simulation can be performed by using other dedicated software. Because the signal interference simulation is not a main purpose of the present invention, the detailed explanation is omitted.

[Wiring Algorithm]

Various algorithms are able to use as the algorithm for the wiring processing. An algorithm for finding a route between two points in a plain is often used for the wiring processing for the wiring of the circuit board. For example, typical algorithms published in the next literatures are used for the wiring processing of the circuit board wiring. Various algorithms and their published literatures:

Lee Algorith: C. Y. Lee, "An algorithm for path connections and its applications". IRE Trans. Electronic Comput. EC-10(3), 1961, p 346-365.

Hadlock algorithm: Hadlock, "A shortest path algorithm for grid graphs," Networks, 1977.

Soukup Algorithm Soukup, "Fast maze router," DAC-78. Combined breadth-_rst and depth-_rst search.

Mikami-Tabuchi algorithm: Mikami & Tabuchi, "A computer program for optimal routing of printed circuit connectors," IFIP, H47, 1968.

Hightower algorithm: Hightower, "A solution to line-routing problem on the continuous plane," DAC-69.

Next, here explained an example of the wiring algorithm used in the present embodiment of the present invention to determine the wiring route of the wiring board by calculation. For example, Lee algorithm, Rip-up-and-reroute wiring mechanism, etc. can be exemplified as the wiring algorithm used in the present invention. The wiring algorithm of the embodiment of the present invention is not restricted to these algorithms, and also can use known optional algorithms such as above-mentioned wiring algorithms.

[Explanation of Lee Algorithm]

Figure 14A:
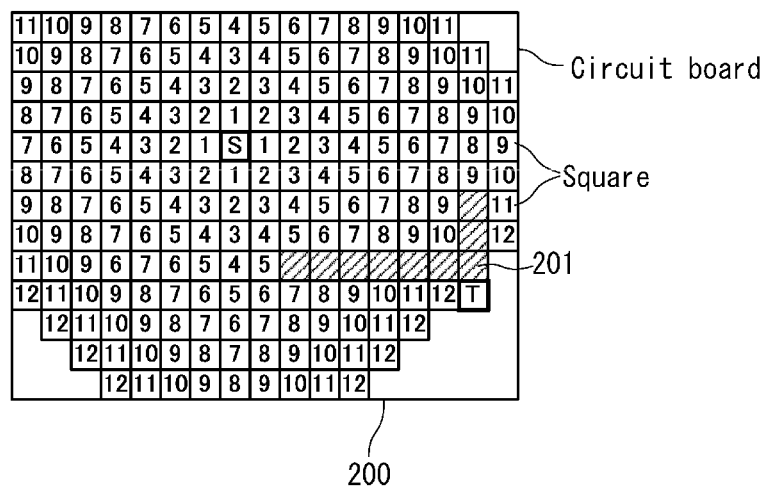
FIGS. 14A-B are explanatory diagrams of Lee algorithm.
Figure 14B:
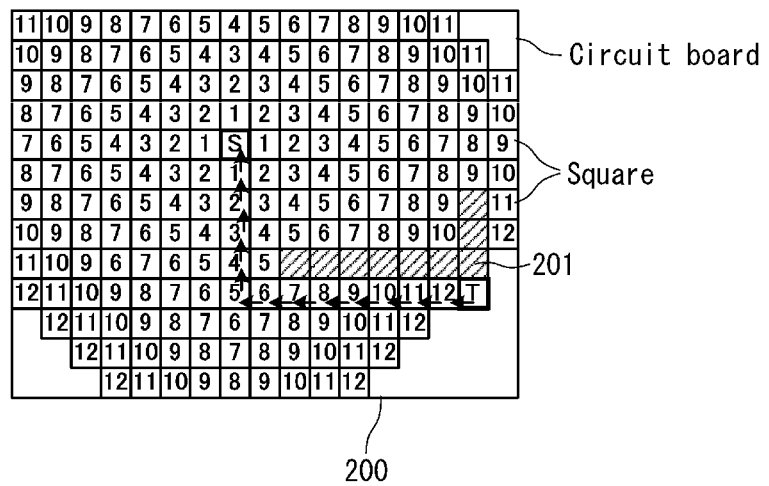

The outline of Lee algorithm will be described with reference of FIGS. 14A and 14B as an example of a wiring algorithm used for calculation of wiring route of the wiring board of the present embodiment of the present invention. Here described a procedure to find a route between two points of a point S and a point T drawn on a circuit board 200 shown in FIGS. 14A and 14B. Lee algorithm can find certainly the shortest route connecting two given points.

However, if the circuit board 200 becomes large and the number of components increases, there was a disadvantage that the calculation required a huge amount of memory and using it in the industry was difficult. In the present invention, because the calculation speed is increased by using a cloud computing and a server having high processing capacity, the calculation speed is high and the response time to the end-user can be reduced. Therefore, for the end-user, it can overcome the disadvantages that Lee algorithm required a huge memory and the response time was slow until output the calculation results and it becomes no need to consider about thereof.

Lee algorithm for finding a route between two points comprises of the next steps. First, it starts from a initialization step. In this step, the wiring board is divided into plural areas. For example, as shown FIG. 14A and FIG. 14B, the wiring board is divided into squares with the same size of horizontal and vertical sides. Here, the route from the start point S to the goal point T is calculated. In the figure, the square, having obstacles to be avoided in the route, has hutchings by slanted solid lines. Each squares has a given number from the start point to the goal point.

First, the point S is selected and this square is given "0". Each square is given numbers as going from the point S to the next square. For example, as shown in FIG. 14A, the square next to the point S is given "1", therefore 4 squares have "1". This is figured out that this is a distance from the S point. Going forward to a next square from the next square having "1", and it is applied by "2". This is repeated until reaching the point T of the goal point. The squares showing the obstacles not be given numbers.

Therefore, applying numbers to the squares means a distance from the point S and it continues until reaching to the point T of the goal point or no squares to apply numbers. To generalize, a square that exists next to the square having a mark i and has any mark is given a mark "i+1". When reaches to the point T, the process applying numbers to the squares is cancelled and a process for route determination is started. When to determine a route from the point T to the point S, while adding a number, one smaller than the number of the point T, to a path, it continues until reaching to the point S.

In the figure, this route is illustrated by the arrow. When this is applied to the wiring of the present invention, the point S of the start point and the point T of the goal point are the two points for a route calculation. For example, the point S and the point T correspond the terminals of the component A and the component B respectively. The hatched squares showing obstacles correspond to newly arranged components, already arranged components, wirings, area that could not be wired and the like. Although, in this example, the circuit board 200 is divided into squares, but can be divided into any quadrangles or triangles instead of squares and the explanation is omitted because its way of a route decision is the same.

Figure 15:
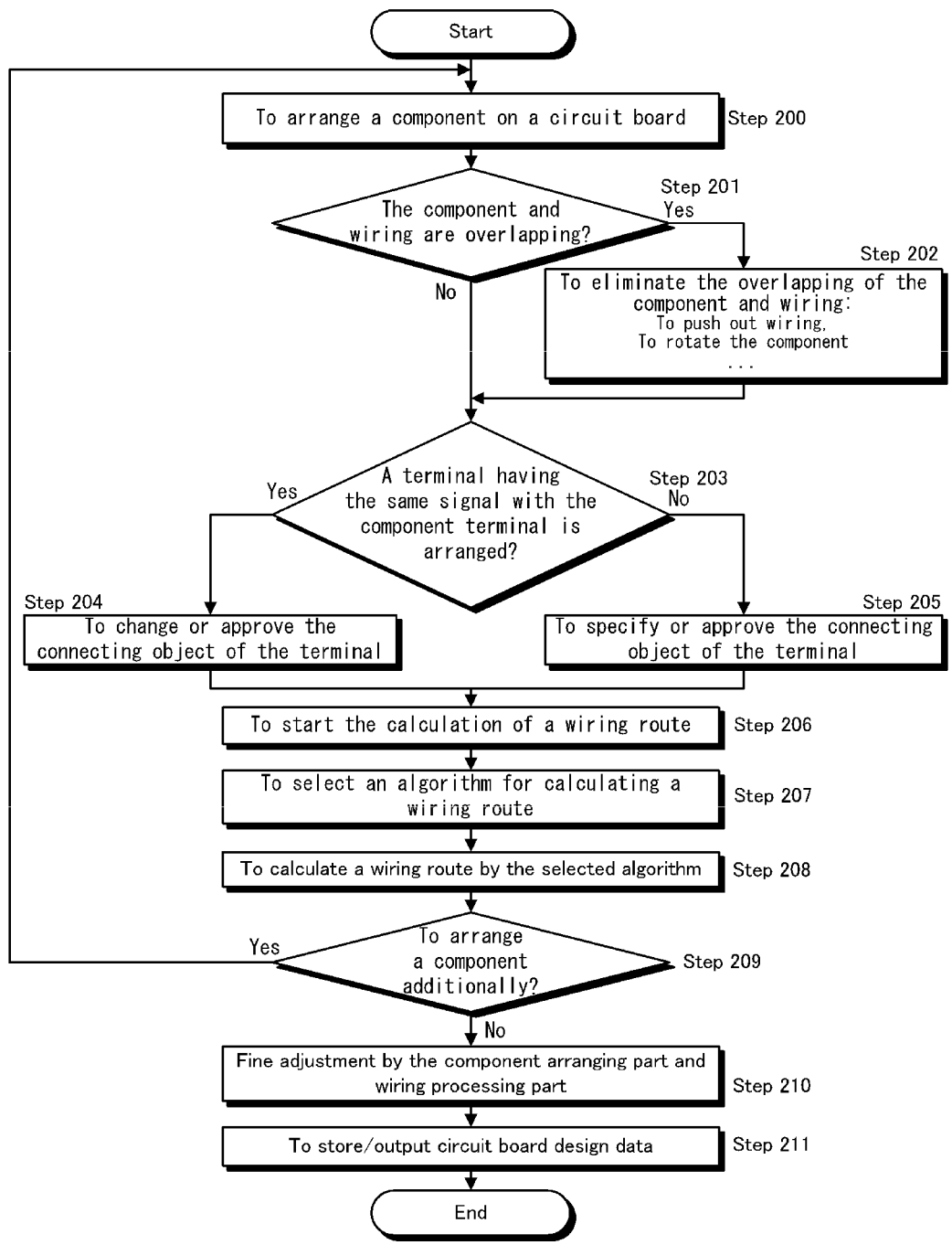
FIG. 15 is a flowchart showing an example of the procedure for a calculation of wiring routing of a wiring board design system 1 of a first embodiment of the present invention.

A detailed procedure of a searching of a wiring routing of the wiring board design is shown in FIG. 15. First, a component is arranged in the circuit board of the wiring board (Step 200). It is confirmed whether wirings that are already wired exist in the arranging position of the component (Step 201). In other words, it is confirmed whether the component that are additionally arranged and the wirings that are already wired are overlapped. If not overlapped, moves to Step 203. If overlapped, a processing is performed to overcome the overlapping (Step 202).

For example, a processing to obtain a space for arranging a component by pushing out the wirings that are overlapped the component and wirings around them, a processing for rotating the component and the like are performed. The situations pushing out the wirings overlapped the component and wirings around them are shown in FIGS. 3A, 3B, 4A and 4B and about them are explained in detail in their explanation. A component has one or more terminals for connecting to a wiring, and a connecting object connecting to this terminal by wiring is determined. In the program, it is the wiring terminal with the same attributes as that of the terminal of the added component, in other words, that of the terminal inputting or outputting the same signal as the inputting or outputting signals of the terminal.

Thus, it is confirmed whether this terminal and the terminal having the same signals are already arranged on the wiring board (Step 203). If a connecting object for the terminal of the additional component exists, this is approved or changed (Step 204). If a connecting object for the terminal of the additional component does not exist, a connecting object for the terminal of the additional component is designated and approved (Step 205). Thereby, the calculation of a wiring route is started (Step 206). First, the calculation of the wiring route starts from selecting algorithms to use in the calculation (Step 207).

The algorithm used in the wiring route can use any wiring processing algorithm above-mentioned. And, for a specific component or a special-purpose wiring board, although a special algorithm can be used, but because the purpose of the present invention is not intended to invent like these algorithms, the detailed explanation is omitted. When the algorithm is selected, the wiring route calculation starts according to the selected algorithm (Step 208). When the wiring route calculation finished and the wiring route of the component is determined, it is confirmed whether the next component is arranged (Step 209).

If a component is arranged additionally, above-mentioned processings of Steps 200-208 are repeated. When the arranging of the component and the wiring route are determined, the component arranging part and the wiring processing part perform the fine adjustment for the component arranging and the wiring route (Step 210). As the fine adjustment is finished, the component arrangement and the wiring route are determined finally. Then, the board design data of the wiring board is saved (Step 211). Accordingly, the board design data of the wiring board can be output in the prescribed format.

The fine adjustment of the above Step 210 is performed by the constraint processing part 25 (See FIG. 2) while confirming constrains and the like of the wiring board. And, the fine adjustment includes a processing so that the wiring route be equalized as much as possible. For this, the fine adjustment can recalculate a route. After determining the wiring route roughly by using fast response algorithms for the calculation of the wiring route, dedicated algorithms with high accuracy can be used for the detailed calculation.

[Screen Example]

Figure 16:
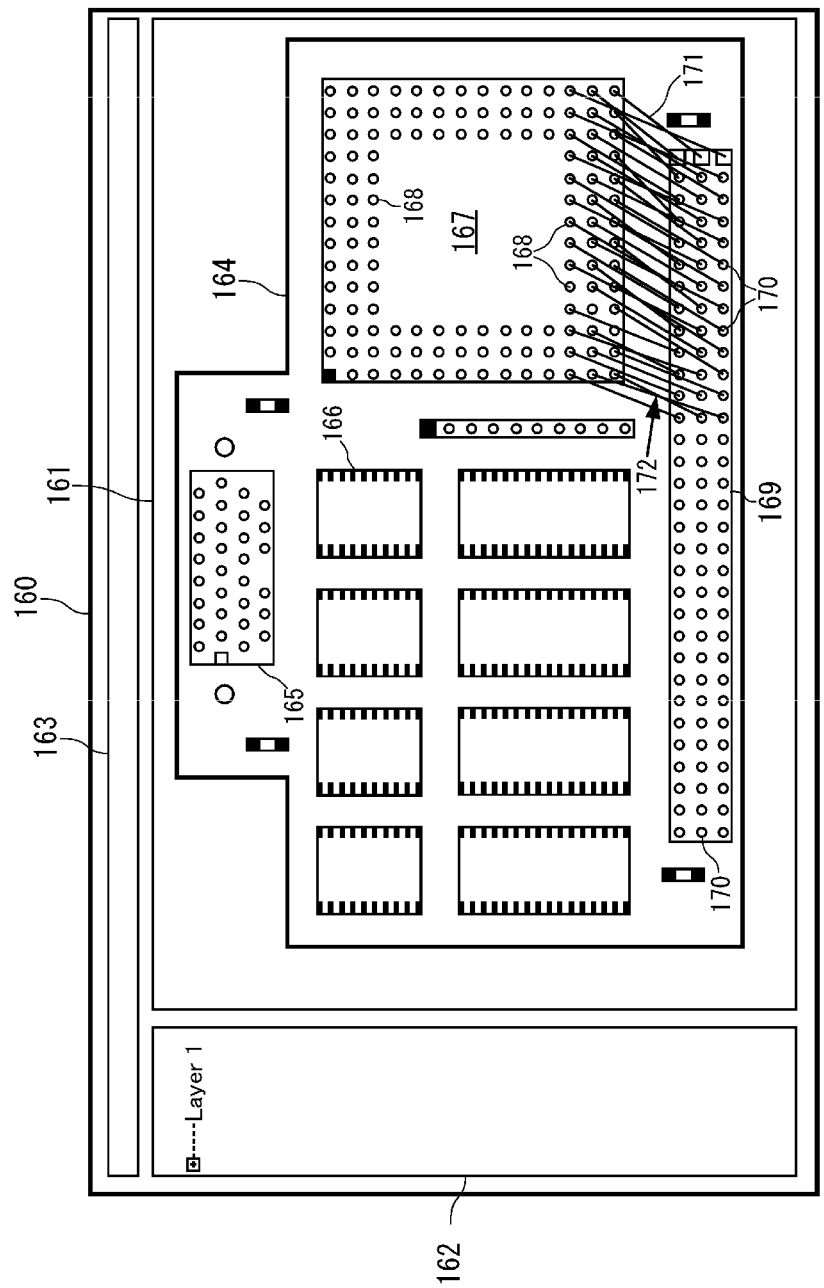
FIG. 16 is a conceptual diagram showing a screen example of a wiring board design system 1 of a first embodiment of the present invention.

FIG. 16 is a screen example showing a situation of designing a wiring using the wiring board design system 1 of the present invention. The screen 160 shown in FIG. 16 shows the situation receiving the wiring board design service after connecting the wiring board design system 1 of the present invention and is a screen example displayed on a screen of the user terminal 3. The screen 160 is an interface screen of a user receiving this wiring board design service.

The screen 160 comprises of a design area 161 for designing a wiring board, an area 162 for displaying layers, status, storing destination, etc. of the wiring board which is designing, a menu area 163 for displaying a menu, tools, etc. In the area 162 can display necessary tools and the like for the wiring board design. These menu and tools are using a general-purpose methods to display them and the detailed explanation is omitted. In the example showing in FIG. 16, a circuit board 164 is displayed in the design area 161 and a plurality of components such as components 165, 166, 167, 169 on the circuit board 164 are arranged and displayed.

Figure 17A:
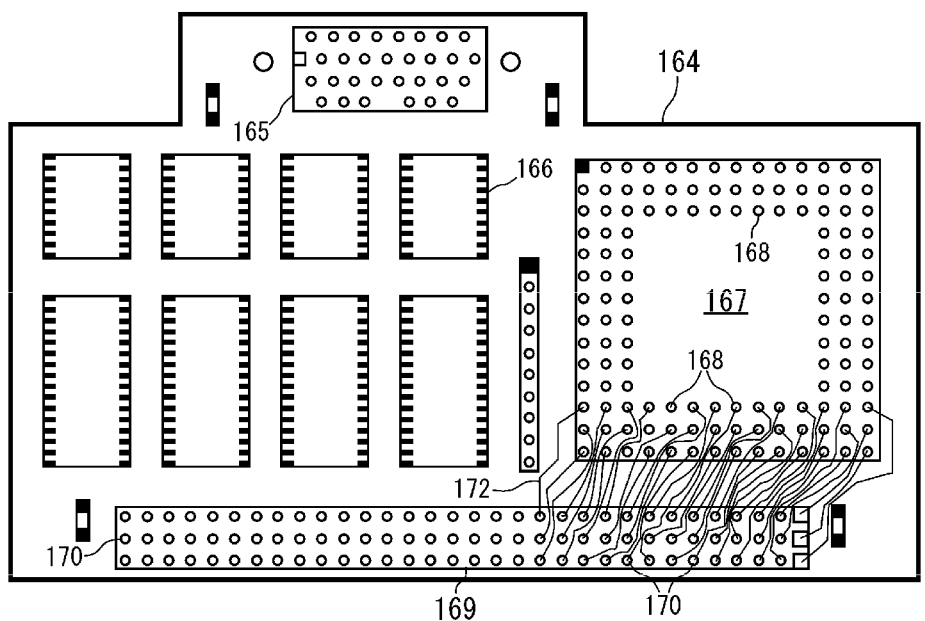
FIGS. 17A-B are conceptual diagrams showing screen examples of the progresses of the wiring calculation of the wiring board design system 1 of the first embodiment of the present invention.
Figure 17B:
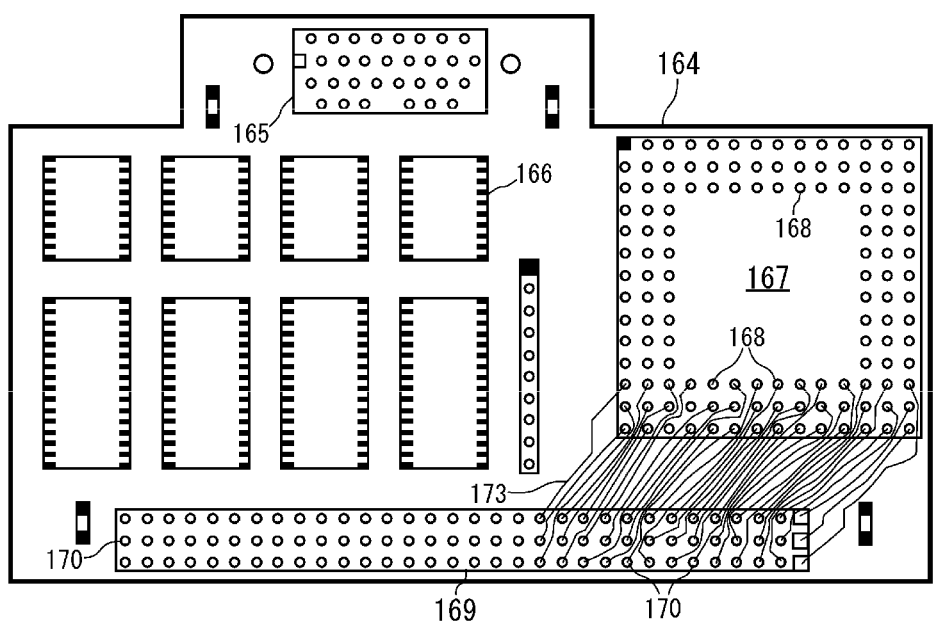

A terminal 168 of the component 167 and a terminal 170 of the component 169 are connected by a wiring 171. Here, the wiring 171 is overlapped as shown by an arrow 172. This wiring 171 is showing a situation connecting these terminals immediately after arranged the component 167 and the component 169. As described below, this overlapped wiring is eliminated by the wiring processing. FIG. 17A and FIG. 17B are screen examples showing processes of the wiring process of the components and illustrating a part of the circuit board 164 shown in FIG. 16.

The overlapped wiring 171 is illustrated in the circuit board 164 of FIG. 16 is calculated a wiring route by the wiring processing part 24 (See FIG. 2) and the overlapped wiring is eliminated. This situation is shown by a wiring 172 in FIG.

17A. After that, similarly, by the wiring processing part 24 and the constraint processing part 25 (See FIG. 2), the fine adjustment of the wiring is performed and if necessary a route calculation of the rewiring is performed. In this fine adjustment, the homogenization of the density of the wiring, the optimization of the arrangement of the components and the like are performed. The situation after this optimization is illustrated in FIG. 17b.

A wiring 173 shown in FIG. 17b has the equal density in comparison with the wiring 172 shown in FIG. 17A. And, the component 167 which is moved to the upper right side of the space than shown in FIG. 17A and the wiring is rewired accordingly.

[About Security]

The wiring board design system 1 of the first embodiment of the present invention provides a cloud environment using the server 2 and the cloud database 5 connected to the network 4. In the cloud environment, the user terminal 3 receives the wiring board design data from the server 2 by using functions for connecting the network 4.

For the business use, a security system is essential for users be fully satisfied. A security system based on a common interface driver disclosed in Japanese Patent No. 5,055,492 (Japanese Patent Application Laid-open No. 2002-328878), U.S. Pat. No. 7,730,497, U.S. Pat. No. 7,395,541 and their family patents can be used as thus security system. The common interface driver is a program located between a fundamental software and a device driver layer of an operating system and is operating in a kernel mode.

The common interface driver is a technology to control sending and receiving data between the fundamental software and the device drivers and it realizes a high-level control function. Especially, it is widely used for a prevention technology of electronic information leaking from an electronic computer and can be applied to the circuit board design system 1 of the present invention. The common interface driver technology can be applied to the user terminal 3 and can prevent a data leakage.

The common interface driver, a driverware and an information security system "4th Eye" (Registered Trade mark), NonCopy (registered Trade Mark), and the like for preventing an information leakage using these technologies are systems provided by the Science Park Corporation (Head office: Zama City, Kanagawa Perfecture, Japan). The present invention is not an invention for such information security system and more explanation is omitted. About these information security systems are described in detail on the Homepage of Science Park Corporation and in above-mentioned patent literatures, etc.

[Others]

The present invention makes possible by a backbone that comprises of high-speed automatic wiring algorithm, data structure and algorithms for pushing out the wiring with the components automatically and high-speed. And, the "Automatic wiring" includes not only connecting signal terminals, but also parallel shift of a component and wiring for the density equalization. Namely, when some of components are arranged and a component is arranged additionally on the circuit board which is wired simultaneously, the wiring is pushed out automatically and the fine adjustment is performed so as the components and wirings being equally.

The wiring processing part 24 calculates the ratio of all wirings on the circuit board to the dimension of the circuit board and the variation of the wiring can be obtained. The wiring processing can be performed so as this variation is minimized, in other words with the equal wiring density, by the wiring processing part 24 or the constraint processing part 25. In this time, processings of rotations of components or movements of arranging positions of the components and processings of obtaining the variation of the wiring are performed repeatedly.

As mentioned above, since the component arrangement and the wiring performed simultaneously, the wiring completed if the component arrangement completed. The efficiency made huge improvement that the conventional methods that perform wiring after the arrangement. Further, it can exam arrangements and wirings before that time continuously in course of the calculation, if necessary it can be easy to recalculate. Thus, the success rate of one shot completion becomes considerably high. In the conventional wiring board design system, when to arrange components additionally, if there is wiring in the desired arranging position, the component must be arranged after erasing the wiring.

On the other hand, in the wiring board design system of the present invention, when to arrange additionally a new component, an existing wiring (wired beforehand) is pushed out and a space for arranging a component is created. In the present embodiment of the wiring board design system, basically, although the designer determines a position to arrange a new component, the difference of the density (unequal) may occur in some areas in the wiring (existing and new). In this situation, the wiring processing part 24 (See FIG. 2) and the like make the wiring as equal as possible by moving the arranged components automatically.

Although, the present example is an example for designing a printed circuit board (PCB), but also can be applied for designing IS (LSI), IC package. And, in the wiring board design system 1 of the present invention, although the arranging work of components is assumed to be manual tasks of designers, but automatic arranging algorithms can be embedded.

INDUSTRIAL APPLICABILITY

The present invention may be utilized in fields requiring a complex circuit design or wiring board design for a printed circuit board, LSI or the like.

The invention claimed is:

1. A wiring board design system for designing a wiring board by arranging a component on a circuit board, wherein said system comprising:
    an information obtaining part for obtaining information concerning a single layer or a multiple layer said circuit board, said component having one or more connection terminal, and a wiring connecting said connection terminal of said component from an input means or selecting or obtaining from a memory means;
    a component arranging part for arranging said component input or selected by said information obtaining part in an appropriate position on said circuit board;
    a wiring processing part for determining a wiring route to said component or between said components arranged by said component arranging part; and
    an output part for outputting design data of said wiring board including said wiring route,
    wherein to determine by calculating said wiring route by said wiring processing part at every time of said arranging of said component or a plurality of said components arranged by said component arranging part, and
    wherein when to push out said wiring,
    said wiring processing part draws a figure of an ellipse or a quadrangle by the shape of said component at a specific distance of at least or more distance that does not affect said component from said wiring; obtains a cross point of a tangent line and said figure, said tangent line is drawn from a terminal of said wiring to said figure; draws a first new wiring from said cross point to said terminal; and draws a second new wiring between said cross points if a plurality of said cross points; wherein said first new wiring and said second new wiring becomes together said pushing wiring.

2. The wiring board design system according to claim 1, wherein when to determine said wiring route by calculating after said arranging of said component, if said component overlaps with said wiring which is determined beforehand, said wiring processing part secures a space for arranging said component by pushing out said overlapped wiring.

3. A wiring board design system for designing a wiring board by arranging a component on a circuit board, wherein said system comprising:
   an information obtaining part for obtaining information concerning a single layer or a multiple layer said circuit board, said component having one or more connection terminal, and a wiring connecting said connection terminal of said component from an input means or selecting or obtaining from a memory means;
   a component arranging part for arranging said component input or selected by said information obtaining part in an appropriate position on said circuit board;
   a wiring processing part for determining a wiring route to said component or between said components arranged by said component arranging part; and
   an output part for outputting design data of said wiring board including said wiring route,
   wherein to determine by calculating said wiring route by said wiring processing part at every time of said arranging of said component or a plurality of said components arranged by said component arranging part, and
   wherein said wiring processing part calculates the variation of ratio of all said wiring on said circuit board to an area of said circuit board, rotates said component or moves said arranging position of said component automatically so as to be the equal wiring density and said wiring processing is performed repeatedly.

4. The wiring board design system according to claim 3, wherein when to determine said wiring route by calculating after said arranging of said component, if said component overlaps with said wiring which is determined beforehand, said wiring processing part secures a space for arranging said component by pushing out said overlapped wiring.

5. A wiring board design method for designing a wiring board by arranging components on a circuit board, wherein said method comprising the next steps of:
   obtaining, by using a computer, from an input means or selecting or obtaining from a memory means information concerning to wiring for connecting said a single layer or a multilayer circuit board, said component having one or more connection terminal, and, said connection terminal of said component;
   arranging, by using a computer, said component, which is input or selected, in an appropriate position on said circuit board;
   determining, by using a computer, a wiring route to said component arranged or between said components by a wiring processing part; and
   outputting, by using a computer, design data of said wiring board including said wiring route,
   wherein when to push out said wiring, said wiring processing part draws a figure of an ellipse or a quadrangle by the shape of said component at a specific distance of at least or more distance that does not affect said component from said wiring; obtains a cross point of a tangent line and said figure, said tangent line is drawn from a terminal of said wiring to said figure; draws a first new wiring from said cross point to said terminal; and draws a second new wiring between said cross points if a plurality of said cross points; wherein said first new wiring and said second new wiring becomes together said pushing wiring.

6. The wiring board design method according to claim 5, wherein when to determine said wiring route by calculating after said arranging of said component, if said component overlaps with said wiring which is determined beforehand, a space for arranging said component is secured by pushing out said overlapped wiring by said wiring processing part.

7. A wiring board design method for designing a wiring board by arranging components on a circuit board, wherein said method comprising the next steps of:
   obtaining, by using a computer, from an input means or selecting or obtaining from a memory means information concerning to wiring for connecting said a single layer or a multilayer circuit board, said component having one or more connection terminal, and, said connection terminal of said component;
   arranging, by using a computer, said component, which is input or selected, in an appropriate position on said circuit board;
   determining, by using a computer, a wiring route to said component arranged or between said components by a wiring processing part; and
   outputting, by using a computer, design data of said wiring board including said wiring route,
   wherein said wiring processing part calculates the variation of ratio of all said wiring on said circuit board to an area of said circuit board, rotates said component or moves said arranging position of said component automatically so as to be the equal wiring density and said wiring processing is performed repeatedly.

8. The wiring board design method according to claim 7, wherein when to determine said wiring route by calculating after said arranging of said component, if said component overlaps with said wiring which is determined beforehand, a space for arranging said component is secured by pushing out said overlapped wiring by said wiring processing part.

9. A wiring board design system for designing a wiring board by arranging a component on a circuit board, wherein said system comprising:
   an information obtaining part for obtaining information concerning a single layer or a multiple layer said circuit board, said component having one or more connection terminal, and a wiring connecting said connection terminal of said component from an input means or selecting or obtaining from a memory means;
   a component arranging part for arranging said component input or selected by said information obtaining part in an appropriate position on said circuit board;
   a wiring processing part for determining a wiring route to said component or between said components arranged by said component arranging part; and
   an output part for outputting design data of said wiring board including said wiring route,
   wherein to determine by calculating said wiring route by said wiring processing part at every time of said arranging of said component or a plurality of said components arranged by said component arranging part,
   wherein said wiring board design system comprising:
      a user terminal for performing designing said wiring board by being operated by a user;

a server comprising of said information obtaining part, said component arranging part, said wiring processing part and said output part; and a communication network for providing data communication between said user terminal and said server, and wherein when to push out said wiring, said wiring processing part draws a figure of an ellipse or a quadrangle by the shape of said component at a specific distance of at least or more distance that does not affect said component from said wiring; obtains a cross point of a tangent line and said figure, said tangent line is drawn from a terminal of said wiring to said figure; draws a first new wiring from said cross point to said terminal; and draws a second new wiring between said cross points if a plurality of said cross points; wherein said first new wiring and said second new wiring becomes together said pushing wiring.

10. The wiring board design system according to claim 9, wherein said wiring board design system comprising: a database storing data concerning constraints of said circuit board, said component and said wiring for use in designing of said circuit board.

11. A wiring board design system for designing a wiring board by arranging a component on a circuit board, wherein said system comprising:

an information obtaining part for obtaining information concerning a single layer or a multiple layer said circuit board, said component having one or more connection terminal, and a wiring connecting said connection terminal of said component from an input means or selecting or obtaining from a memory means;

a component arranging part for arranging said component input or selected by said information obtaining part in an appropriate position on said circuit board;

a wiring processing part for determining a wiring route to said component or between said components arranged by said component arranging part; and an output part for outputting design data of said wiring board including said wiring route, wherein to determine by calculating said wiring route by said wiring processing part at every time of said arranging of said component or a plurality of said components arranged by said component arranging part, wherein said wiring board design system comprising:

a user terminal for performing designing said wiring board by being operated by a user;

a server comprising of said information obtaining part, said component arranging part, said wiring processing part and said output part; and a communication network for providing data communication between said user terminal and said server, and wherein said wiring processing part calculates the variation of ratio of all said wiring on said circuit board to an area of said circuit board, rotates said component or moves said arranging position of said component automatically so as to be the equal wiring density and said wiring processing is performed repeatedly.

12. The wiring board design system according to claim 11, wherein said wiring board design system comprising: a database storing data concerning constraints of said circuit board, said component and said wiring for use in designing of said circuit board.

\* \* \* \* \*